US012772601B2

(12) United States Patent
Xia et al.

(10) Patent No.: US 12,772,601 B2
(45) Date of Patent: Oct. 20, 2026

(54) SOLAR CELL AND PHOTOVOLTAIC MODULE

(71) Applicants: JINKO SOLAR (HAINING) CO., LTD., Haining City (CN); ZHEJIANG JINKO SOLAR CO., LTD., Haining (CN)

(72) Inventors: Zhipeng Xia, Haining City (CN); Wei Wang, Haining City (CN); Jide Huang, Haining City (CN); Changming Liu, Haining City (CN); Xinyu Zhang, Haining City (CN); Hao Jin, Haining City (CN)

(73) Assignees: JINKO SOLAR (HAINING) CO., LTD., Zhejiang (CN); ZHEJIANG JINKO SOLAR CO., LTD., Zhejiang (CN)

( * ) Notice: Subject to any disclaimer, the term of this patent is extended or adjusted under 35 U.S.C. 154(b) by 145 days.

(21) Appl. No.: 18/759,882

(22) Filed: Jun. 30, 2024

(65) Prior Publication Data

US 2025/0301819 A1 Sep. 25, 2025

(30) Foreign Application Priority Data

Mar. 21, 2024 (CN) ......................... 202410330837.6
Mar. 21, 2024 (CN) ......................... 202410338450.5

(51) Int. Cl.
*H10F 77/20* (2025.01)
*H10F 19/80* (2025.01)
(Continued)

(52) U.S. Cl.
CPC ........... *H10F 77/219* (2025.01); *H10F 19/80* (2025.01); *H10F 77/147* (2025.01); *H10F 77/311* (2025.01); *H10F 77/937* (2025.01)

(58) Field of Classification Search
CPC ...... H10F 10/14; H10F 10/146; H10F 19/908; H10F 77/215; H10F 77/147; H10F 77/219; H10F 77/937; H10F 77/311
See application file for complete search history.

(56) References Cited

U.S. PATENT DOCUMENTS 8,580,599 B2 * 11/2013 Rim ...................... H10F 10/146 438/66
10,153,385 B2 12/2018 Mori et al.
(Continued)

FOREIGN PATENT DOCUMENTS

CN 204289472 U 4/2015
CN 106158990 A 11/2016
(Continued)

OTHER PUBLICATIONS

CN 106158990A English machine translation (Year: 2016).*
(Continued)

*Primary Examiner* — Andrew J Golden
(74) *Attorney, Agent, or Firm* — USCH Law, PC

(57) ABSTRACT

Disclosed are a solar cell and a photovoltaic module. In the solar cell, first and second conductive doped portions are arranged in an edge region of a first surface of a substrate. Each first conductive doped portion includes a first doped portion and second doped portions disposed on two opposite sides of the first doped portion, and a dopant concentration of the first doped portion is greater than that of the second doped portions. A passivation layer is disposed on the first surface. The second edge fingers are disposed on the second conductive doped portions respectively. Each first edge finger includes a first sub-finger and a second sub-finger, disposed on the second doped portions respectively. The second sub-finger is connected to the first sub-finger via the first doped portion. An edge busbar disposed on the passi-
(Continued)

vation layer and on the first doped portion is connected to the second edge fingers.

20 Claims, 16 Drawing Sheets

(51) Int. Cl.
*H10F 77/00* (2025.01)
*H10F 77/14* (2025.01)
*H10F 77/30* (2025.01)

(56) References Cited

U.S. PATENT DOCUMENTS

2011/0041908 A1* 2/2011 Harder .................. H10F 10/146 438/57
2012/0160311 A1* 6/2012 Ha .......................... H10F 10/14 257/E31.127
2012/0174975 A1* 7/2012 Shin ........................ H10F 10/14 136/256
2013/0098434 A1* 4/2013 Imoto ...................... H10F 10/14 136/255
2017/0018677 A1* 1/2017 Le Perchec ............. H10F 10/14
2019/0245107 A1* 8/2019 Murao .................. H10F 77/311
2026/0114074 A1* 4/2026 Tong ..................... H10F 10/146

FOREIGN PATENT DOCUMENTS

CN 211088284 U 7/2020
CN 214313221 U 9/2021
CN 115425098 A 12/2022
CN 218385237 U 1/2023
CN 218730966 U 3/2023
CN 116544287 A 8/2023
CN 116722055 A 9/2023
CN 116722060 A 9/2023
CN 112349791 B 11/2023
CN 117334793 A 1/2024
CN 117727813 A 3/2024
JP 2009164509 A 7/2009
WO WO-2009147890 A1 * 12/2009 ........... H10F 19/908
WO 2023024585 A1 3/2023
WO 2023050824 A1 4/2023
WO 2023103971 A1 6/2023

OTHER PUBLICATIONS

WO 2009/147890A1 English machine tranlsation (Year: 2009).*
Jinko Solar (Haining) Co., Ltd et al, European patent search report, EP 24213733.9, Apr. 24, 2025, 6 pgs.
Zhang Wei, et al., "The Establishmentand Optimization of Rear Emitter Model for N-Type IBC Solar Cells", ACTA Energiae Solaris Sinica, vol. 36, No. 5, May 2015, 4 pgs.

* cited by examiner

SOLAR CELL AND PHOTOVOLTAIC MODULE

CROSS REFERENCE TO RELATED APPLICATIONS

This application claims the benefit of priority under the Paris Convention to Chinese Patent Application No. CN202410338450.5, entitled "SOLAR CELL AND PHOTOVOLTAIC MODULE," filed on Mar. 21, 2024, and Chinese Patent Application No. CN202410330837.6, entitled "SOLAR CELL AND PHOTOVOLTAIC MODULE," filed on Mar. 21, 2024, each of which is incorporated by reference herein in its entirety.

TECHNICAL FIELD

The various embodiments described in this document relate in general to the field of photovoltaic technologies, and in particular, to a solar cell and a photovoltaic module.

BACKGROUND

At present, as fossil fuels are gradually exhausted, solar cells have wider applications as a new energy alternative solution. A solar cell is an apparatus that converts light energy of the sun into electric energy. The solar cell generates carriers by using a photovoltaic effect principle and introduces the carriers out by using an electrode, which is conducive to effective utilization of the electric energy.

An interdigitated back contact (IBC) cell refers to a back-junction back-contact solar cell structure in which positive and negative metal electrodes are arranged in an interdigitated manner on the backlight side of the cell. The IBC cell is one of the photovoltaic cells with the highest conversion efficiency at present. The cell uses monocrystal silicon as a substrate, and a p-n junction and metal electrodes are all disposed on the back surface of the cell, and no metal electrodes are disposed on the front surface to block light, such that a very high short-circuit current and conversion efficiency are achieved. However, there are still many reasons for affecting the cell performance of IBC cells, so the photoelectric conversion efficiency as well as the structure of IBC cells need to be improved.

SUMMARY

Embodiments of the present disclosure provide a solar cell and a photovoltaic module, which at least improve the performance of the solar cell.

In one aspect, the embodiments of the present disclosure provide a solar cell. The solar cell includes a substrate. The substrate has a first surface. The first surface includes a central region and edge regions that are disposed on two opposite sides of the central region. Each of the edge regions extends along a first direction. First conductive doped portions and second conductive doped portions are arranged in the edge region and are alternatingly arranged in the first direction. The first conductive doped portions have a conductivity type different from the second conductive doped portions. A respective first conductive doped portion of the first conductive doped portions includes a first doped portion and second doped portions disposed on two opposite sides of the first doped portion along a second direction. A dopant concentration of the first doped portion is greater than a dopant concentration of the second doped portions. The solar cell further includes a passivation layer, disposed on the first surface. The solar cell further includes a plurality of fingers disposed on the first surface. The plurality of fingers extend through the passivation layer along a thickness direction of the passivation layer, and include first edge fingers and second edge fingers that are alternatingly arranged along the first direction. Along a thickness direction of the second conductive doped portions, a respective second edge finger of the second edge fingers is disposed on a respective one of the second conductive doped portions. A respective first edge finger of the first edge fingers includes a first sub-finger and a second sub-finger that are spaced apart along a direction away from the central region. Along a thickness direction of the first conductive doped region, the first sub-finger and the second sub-finger are disposed on two second doped portions arranged along a second direction, respectively. The second sub-finger is connected to the first sub-finger via the first doped portion. The solar cell further includes edge busbars extending along the first direction. Along the thickness direction of the passivation layer, the edge busbars are disposed on the passivation layer, and over first doped portions. The edge busbars are connected to the second edge fingers.

In another aspect, the embodiments of the present disclosure further provide a photovoltaic module. The photovoltaic module includes: at least one cell string, including a plurality of solar cells as described above; at least one connection portion, each configured to electrically connect two adjacent solar cells of the plurality of solar cells; at least one encapsulation adhesive film, configured to cover surfaces of the at least one cell string; and at least one cover plate, configured to cover surfaces of the encapsulation adhesive film away from the at least one cell string.

BRIEF DESCRIPTION OF THE DRAWINGS

One or more embodiments are illustrated by way of example with reference to the accompanying drawings, and these exemplary descriptions do not constitute a limitation of the embodiments. The drawings are not to scale, unless otherwise stated. For clearer descriptions of the technical solutions in the embodiments of the present disclosure or in the related art, drawings that are to be referred for description of the embodiments are briefly described hereinafter. Apparently, the drawings described hereinafter merely illustrate some embodiments of the present disclosure. Persons of ordinary skill in the art may also derive other drawings based on the drawings described herein without any creative effort.

DETAILED DESCRIPTION OF THE EMBODIMENTS

Figure 1:
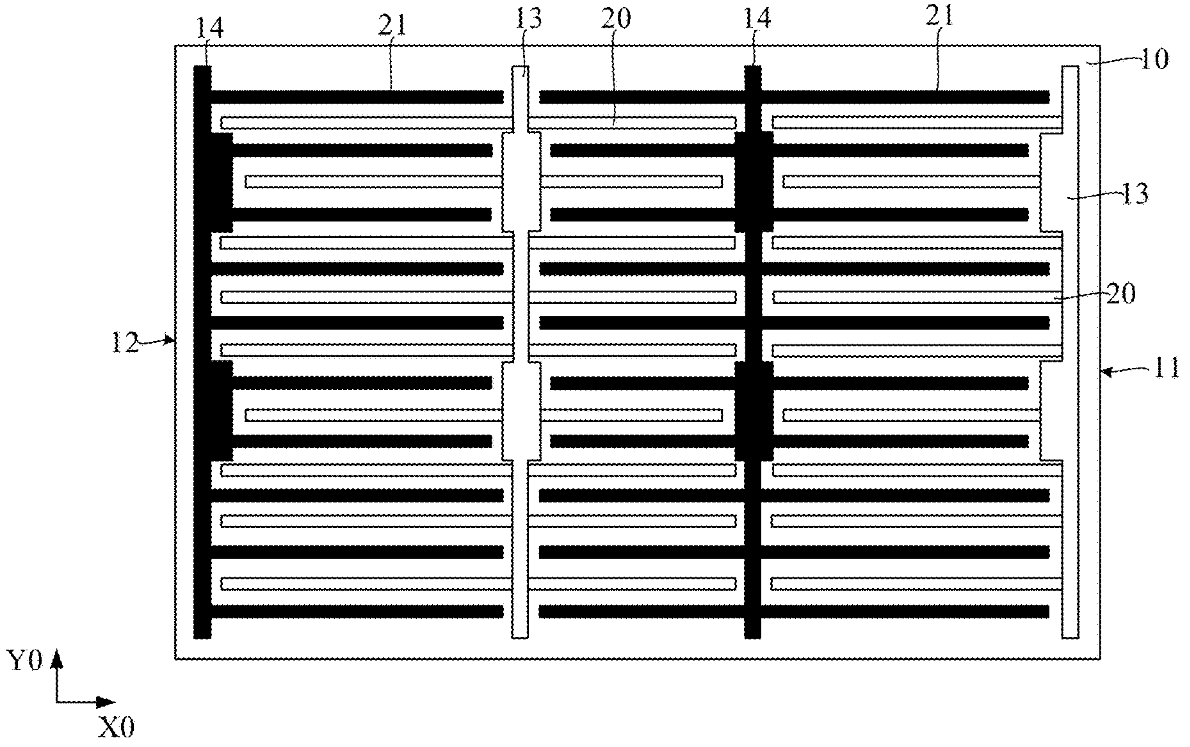
FIG. 1 is a schematic structural diagram of back gridlines of a solar cell of a first type in the related art.

As used herein, features (e.g., regions, structures, or devices) described as being "adjacent" to each other mean and include features having one or more of the disclosed identifiers that are positioned closest (e.g., nearest) to each other. One or more of the disclosed identified additional features (e.g., additional regions, additional structures, additional devices) that do not match "adjacent" features may be disposed between the "adjacent" features. In other words, "adjacent" features may be defined as being directly adjacent to each other such that no other features intervene between the "adjacent" features; or "adjacent" features may be defined as being in indirect proximity to each other such that at least one feature having an identity other than the identity associated with the at least one "adjacent" feature is positioned between the "adjacent" features.

In the description hereinafter, a second member is formed or arranged over or on a first member, or a second member is formed or arranged on a surface of a first member, or a second member is formed or arranged on a side of a first member. Such description covers an embodiment where the first member is in direct contact with the second member, or may cover an embodiment where an additional member is arranged between the first member and the second member, such that the first member may not be in direct contact with the second member. Various members may be arbitrarily drawn to scale for simplicity and clarity. In the drawings, some of the layers/members may be omitted for simplicity.

Unless otherwise specified, the description that the second member is formed or arranged on the surface of the first member means that the first member is in direct contact with the second member.

Herein, the "member" may refer to a layer, a film, a region, a part, a structure, or the like.

Additionally, for ease of description, relative terms such as "under," "beneath," "lower part," "above," and "upper part" can be used to describe the relationship between one element or component and another (or others), as shown in the figure. Besides the orientations shown in the drawings, relative terms are intended to encompass different orientations of the device in use or operation. The device may be oriented differently (e.g., rotated 90 degrees or in other orientations), and the relative descriptors used in this text can be interpreted accordingly. In the following embodiments, terms such as "upper part," "above," and/or "over" are defined as the direction in which the distance from the front and rear surfaces increases. Materials, configurations, dimensions, processes, and/or operations as described in the embodiments may be employed in other embodiments, and detailed descriptions thereof may be omitted.

As used herein, spatially relative terms, such as "below," "below," "lower," "bottom," "above," "upper," "top," "front," "back," "left," "right," and the like, may be used for ease of description to describe a relationship between one element or feature and another element or feature as illustrated in the drawings. Unless otherwise specified, the spatially relative terms are intended to encompass different orientations of the materials in addition to the orientation depicted in the drawings. For example, if the materials in the drawings are inverted, elements described as "under" or "beneath" or "below" or "bottom" other elements or features would then be oriented "above" or "top" the other elements or features. Thus, the term "under" may encompass both an orientation above and below depending on the context in which the term is used, as will be apparent to those of ordinary skill in the art. The materials may be otherwise oriented (e.g., rotated 90 degrees, inverted, flipped) and the spatially relative descriptors used herein may be interpreted accordingly.

Unless apparent from the context, the terms "connect" and various derivatives thereof, such as "connected," "connecting," "connection," and the like, as used herein, may refer to electrical connections.

As used herein, the term "and/or" refers to and encompasses any and all possible combinations of one or more of the associated listed items.

It is known from BACKGROUND that the photoelectric conversion efficiency and structure of the IBC cell needs to be enhanced.

Figure 2:
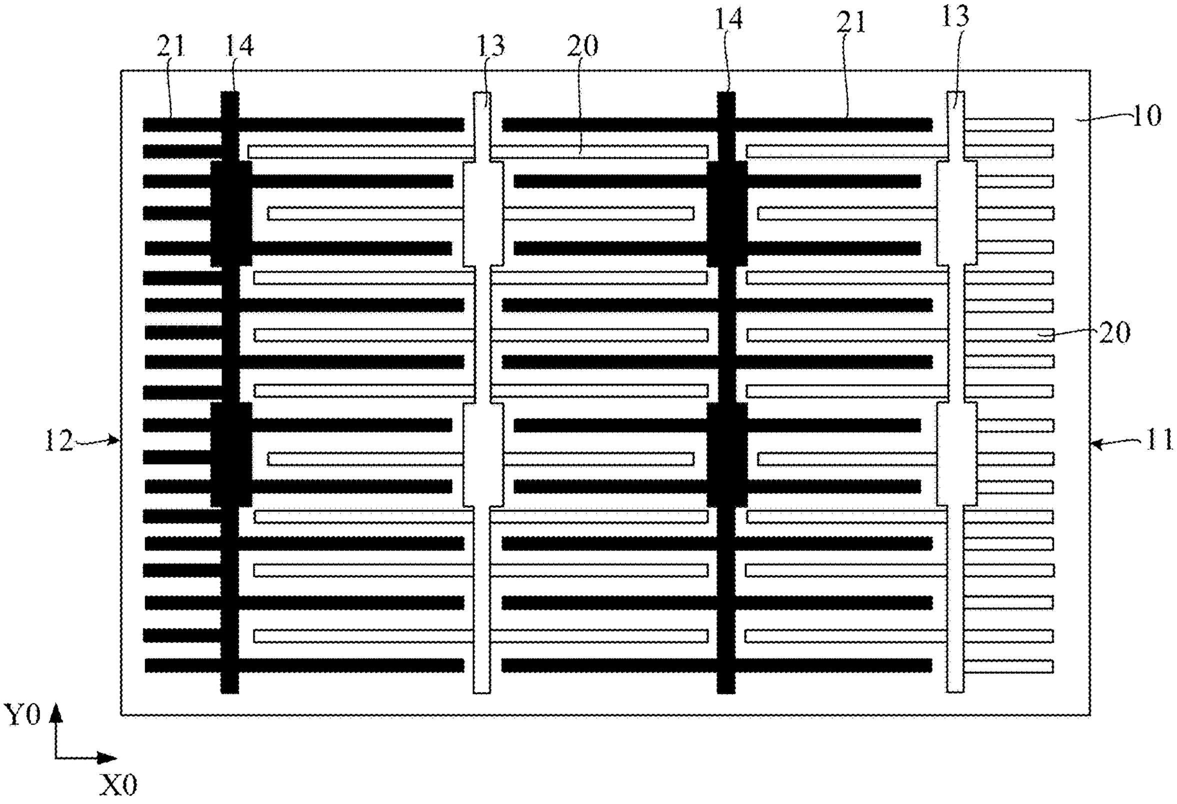
FIG. 2 is a schematic structural diagram of back gridlines of a solar cell of a second type in the related art.
Figure 3:
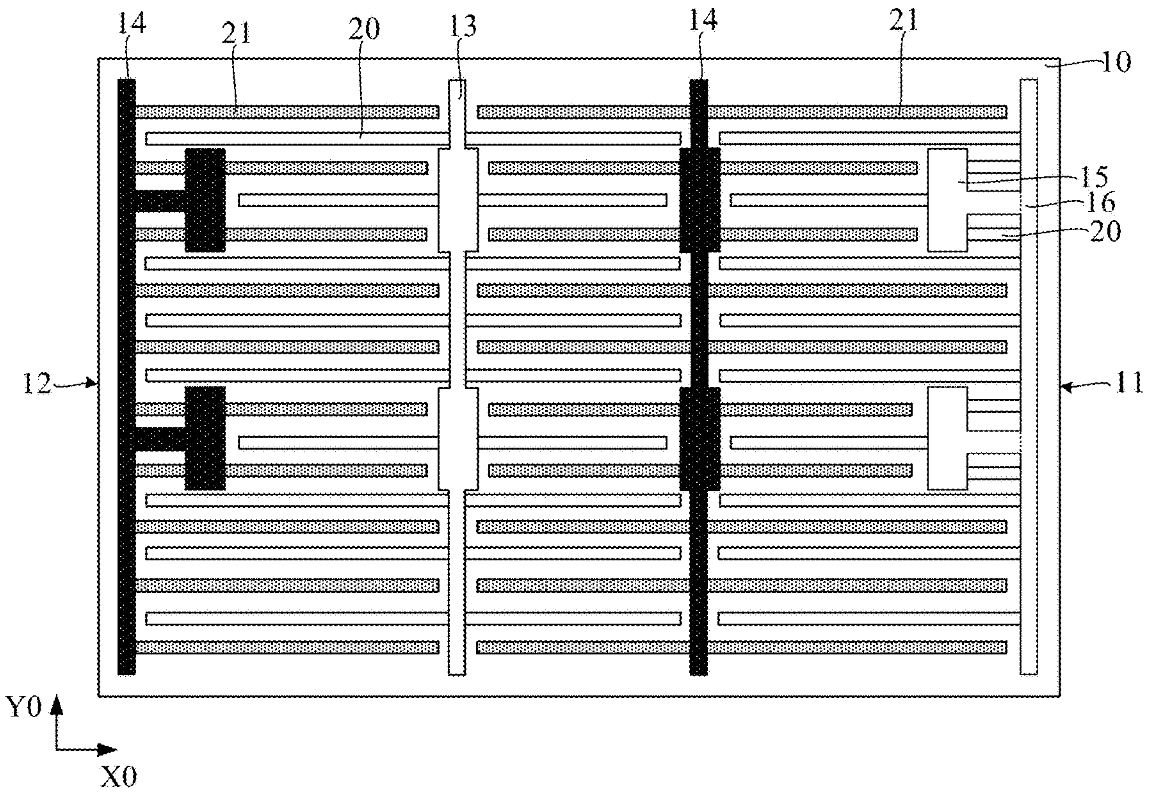
FIG. 3 is a schematic structural diagram of back gridlines of a solar cell of a third type in the related art.
Figure 4:
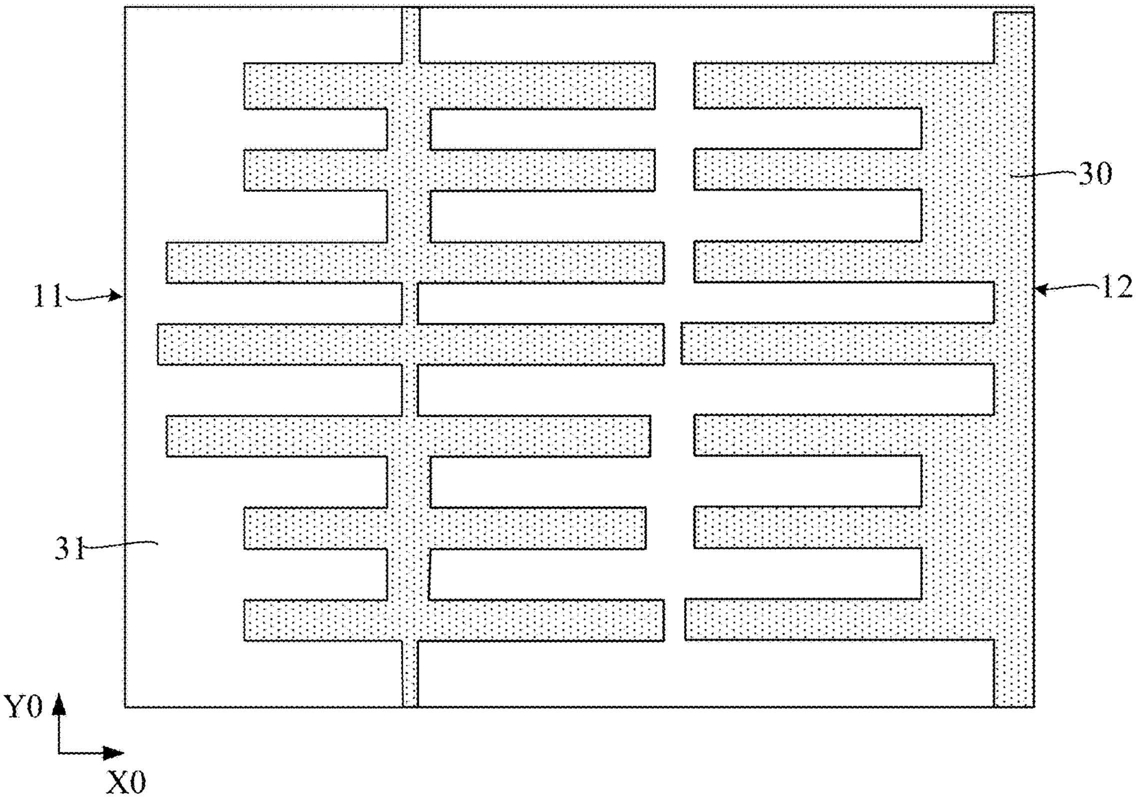
FIG. 4 is a schematic structural diagram of doped regions of a solar cell in the related art.

FIG. 1 is a schematic structural diagram of back gridlines of a solar cell of a first type in the related art. FIG. 2 is a schematic structural diagram of back gridlines of a solar cell of a second type in the related art. FIG. 3 is a schematic structural diagram of back gridlines of a solar cell of a third type in the related art. FIG. 4 is a schematic structural diagram of doped regions of a solar cell in the related art.

Referring to FIG. 1 to FIG. 3, through analysis, in conventional back-contact solar cells, that is, IBC cells, gridlines for collecting carriers are all disposed on the back surface of the cell, and P-type doped regions and N-type doped regions that are alternatingly arranged are arranged on the back surface of a substrate. The gridlines may include a plurality of fingers that extend through a passivation layer along a thickness direction of the substrate, and are in contact with the doped regions, and include a plurality of busbars over a portion of the passivation layer and a portion of the fingers. The fingers include a plurality of first fingers 20 disposed on the N-type doped regions and a plurality of second fingers 21 disposed on the P-type doped regions. Typically, the first fingers 20 and the second fingers 21 are alternatingly arranged along a first direction Y0, and all extend along a second direction X0. The busbars include first busbars 13 intersected with and connected to the first fingers 20, and second busbars 14 intersected with and connected to the second fingers 21. Since an extension direction of the busbars is intersected with an extension direction of the fingers, in arrangement of the gridlines, the fingers need to be insulated from the busbars having a polarity different from the fingers. That is, the first fingers 20 are insulated from the second busbars 14, and the second fingers 21 are insulated from the first busbars 13.

In the related art, arrangement of back gridlines of a back-contact solar cell is as illustrated in FIG. 1. The busbars extend along the first direction Y0, and the fingers extend along the second direction X0. The first direction Y0 is intersected with the second direction X0. A solar cell 10 has two edges opposite to each other along the second direction X0, namely, a first edge 11 and a second edge 12. Along the second direction X0, the busbars include two edge busbars disposed on an outermost side, and the two edge busbars may be a first busbar 13 adjacent to the first edge 11 and a second busbar 14 adjacent to the second edge 12, respectively. No fingers of any polarity are arranged between the first busbar 13 and the first edge 11, and no fingers of any polarity are arranged between the second busbar 14 and the second edge 12. The edge busbars are relatively close to the adjacent edges. During subsequent formation of a photovoltaic module, solder strips need to be soldered to the busbars to connect a plurality of solar cells 10. Since the edge busbars are closer to the edges, and the edges of the solar cells 10 may have micro cracks, stress concentration may be caused during the process of soldering the edge busbars to the solder strips. As a result, the solar cells 10 may be subjected to cracks, and hence the yield of the photovoltaic module is low and the reliability of the solar cells 10 is poor.

Referring to FIG. 2, in the case that the edge busbars are moved by a specific distance towards the central region, that is, a specific spacing is defined between the first busbar 13 and the first edge 11, and a specific spacing is also defined between the second busbar 14 and the second edge 12, the first fingers 20 having the same polarity as the first busbar 13 are only arranged between the first busbar 13 and the first edge 11, and the second fingers 21 having the same polarity as the second busbar 14 are only arranged between the second busbar 14 and the second edge 12. As such, the carriers generated in the substrate close to the first edge 11 need to be transported by a long distance to be collected by the second fingers 21, and are hence collected the second busbar 14 disposed in the central region of the solar cell 10; and the carriers generated in the substrate close to the second edge 12 need to be transported by a long distance to be collected by the first fingers 20, and are hence collected by the first busbar 13 disposed in the central region of the solar cell 10. In this way, during the long-distance diffusion, the recombination loss may decrease the short-circuit current, increase the series resistance, and reduces the fill factor, and lowers the photoelectric conversion efficiency of the solar cell.

Referring to FIG. 3, in the edge busbar, a busbar body 16 and a solder point 15 are separately arranged. The solder point 15 is moved by a specific distance towards the central region of the solar cell 10 to mitigate hidden cracks during the soldering, and the busbar body 16 of the edge busbar is still arranged at the edge of the solar cell 10. As such, collection of the carriers at the edge may be improved to some extent. However, such arrangement still has some demerits. Referring to FIG. 4, since a specific spacing is defined between the solder point close to the first edge 11 and the first edge 11, and a specific spacing is defined between the solder point close to the second edge 12 and the second edge 12, there are still entire P-type doped regions 31 having a large area in the doped regions close to the first edge 11, and there are still entire N-type doped regions 30 having a large area in the doped regions close to the second edge 12, that is, the N-type doped regions and the P-type doped regions in some of the doped regions close to the edges are not alternatingly arranged but are relatively uniformly arranged. In this way, the carriers generated in the doped regions close to the edges are still subjected to long-distance diffusion. Therefore, during the long-distance diffusion, the recombination loss may decrease the short-circuit current, increase the series resistance, reduces the fill factor, and lowers the photoelectric conversion efficiency of the solar cell.

To address the above problem, some embodiments of the present disclosure provide a solar cell and a photovoltaic module. In the solar cell, specific spacing may be defined between the edge busbar, that is close to the edge and disposed on the outermost side, and the edge, and the second sub-fingers of different polarity from the edge busbar may be arranged between the edge busbar and the edge closes to the edge busbar. The second sub-finger and the first sub-finger on a side, away from the corresponding edge, of the edge busbar are connected to each other via the first doped portion under the edge busbar. In this way, the recombination loss during the transportation of the edge carries is reduced, the edge busbar is prevented from being arranged excessively close to the edge, and cracks of the solar cell due to the stress concentration during the soldering are mitigated, such that the reliability of the solar cell is improved.

The embodiments of the present disclosure are described in detail with reference to the accompanying drawings.

However, persons of ordinary skill in the art may understand, in the embodiments of the present disclosure, more technical details are provided for readers to better understand the present disclosure. However, even though these technical details and various variations and modifications based on the embodiments hereinafter, the technical solutions of the present disclosure may also be realized.

Figure 5:
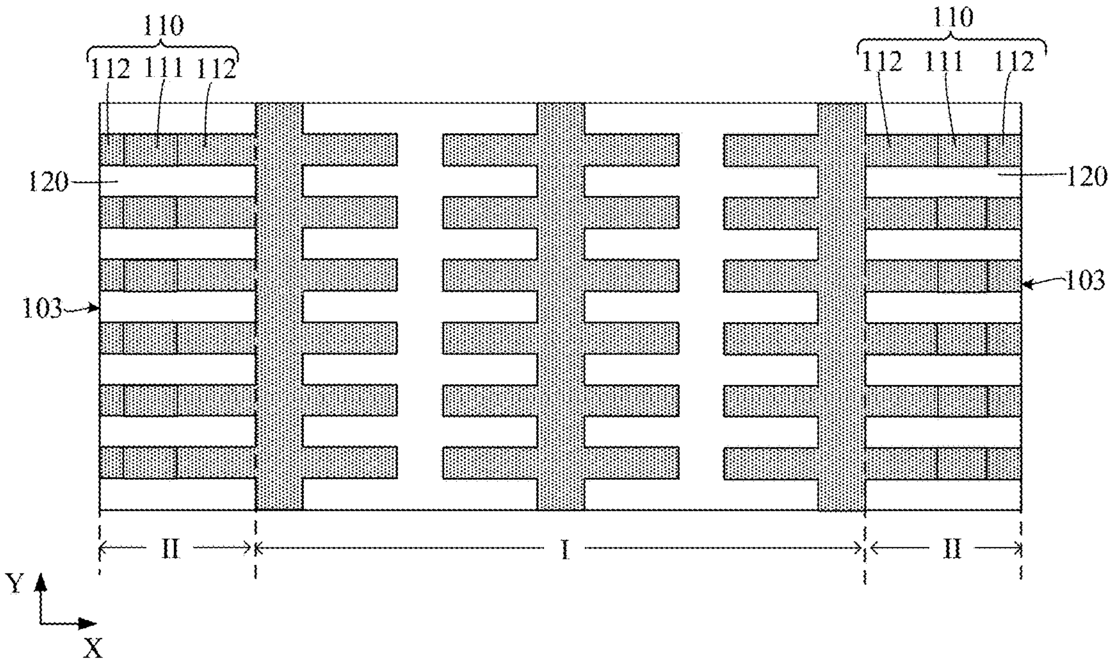
FIG. 5 a schematic diagram illustrating a top view of a first surface of a solar cell according to some embodiments of the present disclosure.
Figure 6:
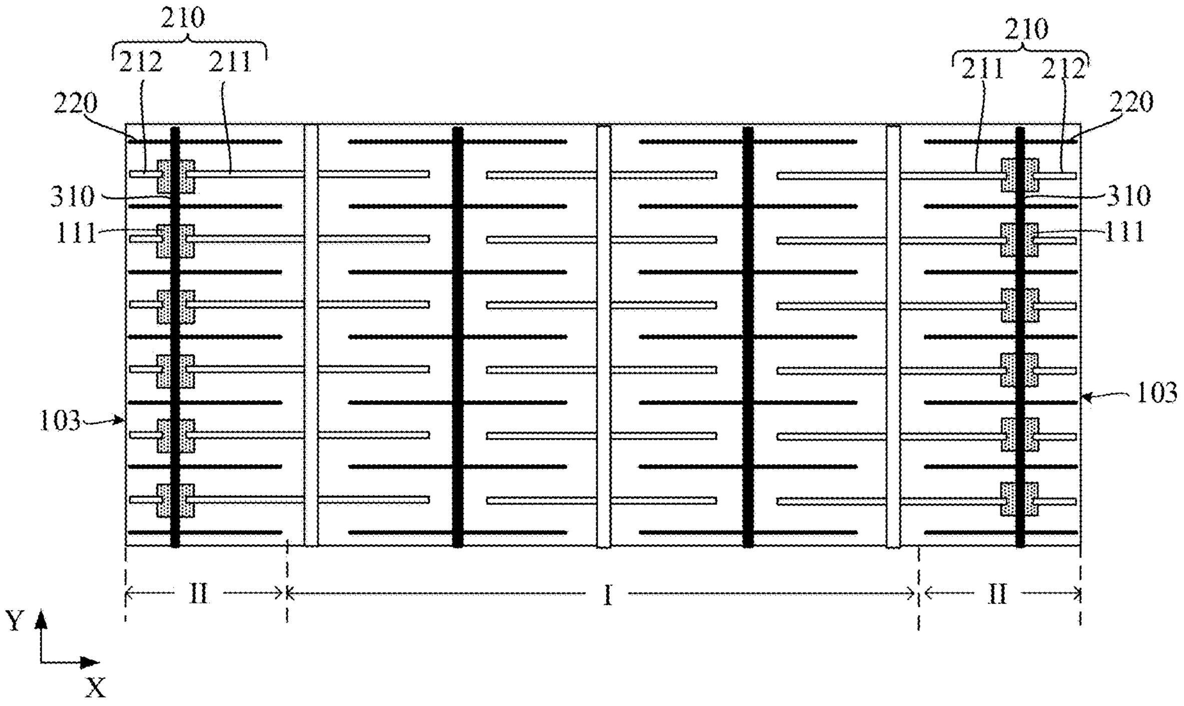
FIG. 6 is a schematic structural diagram of back gridlines of a solar cell according to some embodiments of the present disclosure.
Figure 7:
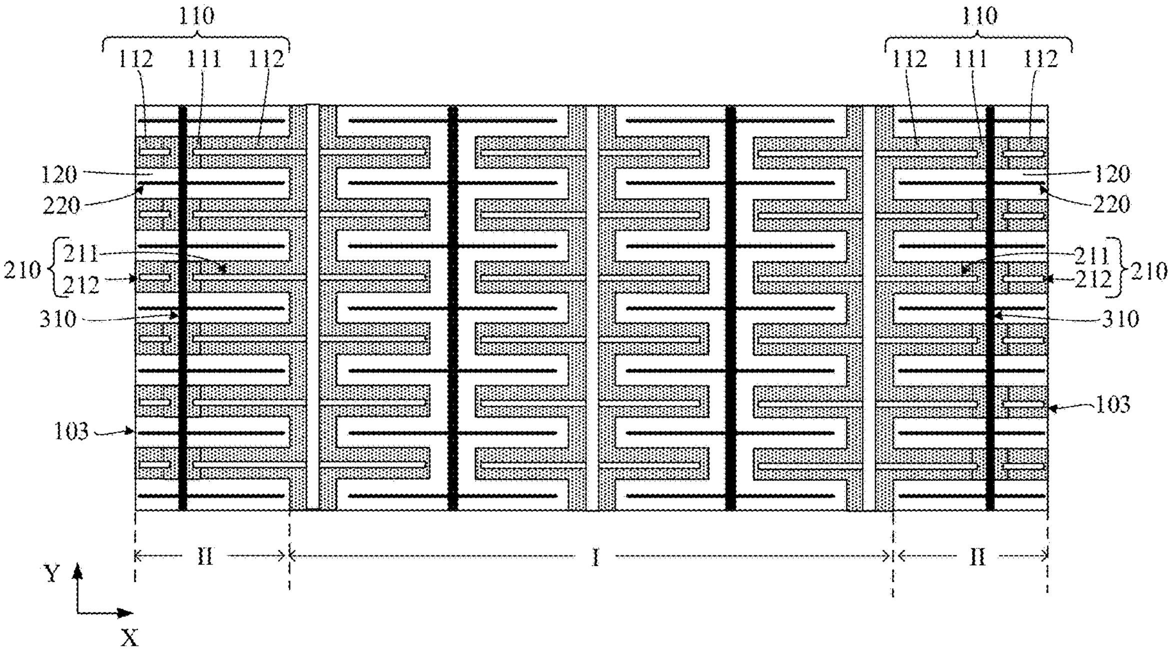
FIG. 7 is a schematic structural diagram of a back surface of a solar cell according to some embodiments of the present disclosure.
Figure 8:
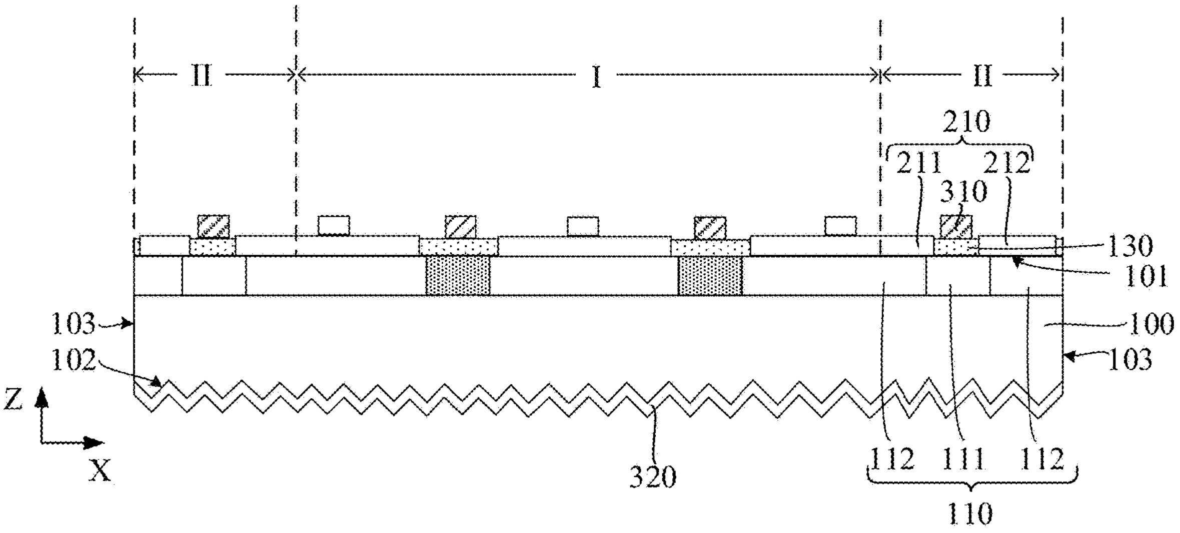
FIG. 8 is a schematic diagram illustrating a partial sectional view of a solar cell including first edge fingers according to some embodiments of the present disclosure.
Figure 9:
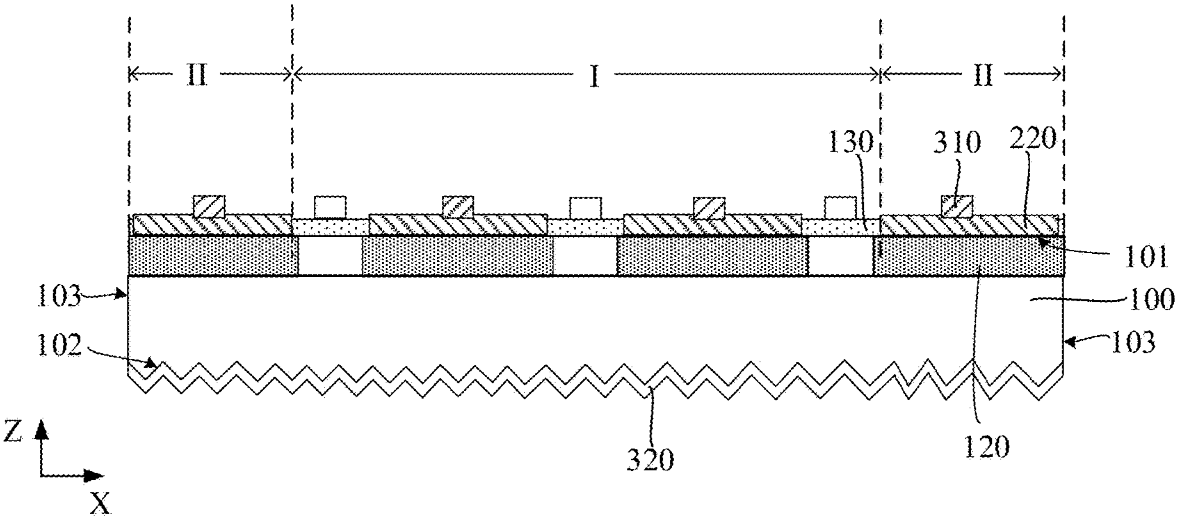
FIG. 9 is a schematic diagram illustrating a partial sectional view of a solar cell including second edge fingers according to some embodiments of the present disclosure.

FIG. 5 is a schematic diagram illustrating a top structure of a first surface of a solar cell according to some embodiments of the present disclosure. FIG. 6 is a schematic structural diagram of back gridlines of a solar cell according to some embodiments of the present disclosure. FIG. 7 is a schematic structural diagram of a back surface of a solar cell according to some embodiments of the present disclosure. FIG. 8 is a schematic diagram illustrating a partial sectional view of a solar cell including first edge fingers according to some embodiments of the present disclosure. FIG. 9 is a schematic diagram illustrating a partial sectional view of a solar cell including second edge fingers according to some embodiments of the present disclosure.

Referring to FIG. 5 to FIG. 9, some embodiments of the present disclosure provide a solar cell. The solar cell includes a substrate 100, a passivation layer 130, a plurality of fingers, and edge busbars 310. The substrate 100 includes a first surface 101. The first surface 101 includes a central region I and edge regions II disposed on two opposite sides of the central region I. The edge regions II extend along a first direction Y. The edge region II includes first conductive doped portions 110 and second conductive doped portions 120 that are alternatingly arranged along the first direction Y. The first doped portions 111 has a conductivity type different from the second conductive doped portion 120. Each first conductive doped portion 110 includes a first doped portion 111 and second doped portions 112 disposed on two opposite sides of the first doped portion 111 along a second direction X. A dopant concentration of the first doped portion 111 is greater than a dopant concentration of the second doped portions 112. The passivation layer 130 is disposed on the first surface 101. The fingers extend through the passivation layer 130 along a thickness direction of the passivation layer 130. The fingers include first edge fingers 210 and second edge fingers 220 that are alternatingly arranged along the first direction Y. Along a thickness direction of the second conductive doped portions 120, a respective second edge finger of the second edge fingers is disposed on a respective one of the second conductive doped portions 120. The first edge finger 210 includes a first sub-finger 211 and a second sub-finger 212 that are spaced apart along a direction away from the central region I. Along a thickness direction of the first conductive doped portion 110, the first sub-finger 210 and the second sub-finger 212 are disposed on two second doped portions 112 arranged along the second direction X, respectively. The second sub-finger 212 is connected to the first sub-finger 211 via the first doped portion 111. The edge busbars 310 extend along the first direction Y. Along the thickness direction of the passivation layer 130, each edge busbar 310 is disposed on the passivation layer 130, and over the first doped portion 111, and is connected to the second edge fingers 220.

The substrate 100 has two opposite edges 103. The edge busbar 310 is the busbar closest to the edge 103. A specific spacing is defined between the edge busbar 310 and the edge 103. The second sub-fingers 212 having a different polarity from the edge busbar 310 may be defined between the edge busbar 310 and the edge 103 close to the edge busbar 310. The second sub-finger 212 is connected to the first sub-finger 211 disposed on a side, away from the corresponding edge 103, of the edge busbar 310 via the first doped portion 111 under the edge busbar 310. The edge region II includes first conductive doped portions 110 and second conductive doped portions 120 that are alternatingly arranged along the first direction Y. One of the first conductive doped portion 110 and the second conductive doped portion 120 is a P-type doped region, and the other of the first conductive doped portion 110 and the second conductive doped portion 120 is an N-type doped region. In this way, N-type doped regions and P-type doped regions in the edge region II are evenly distributed, the first conductive doped region 110 or the second conductive doped region 120 having a large area is avoided in the edge region II, the recombination loss during transportation of the carriers in the edge region II is reduced, and the edge busbar 310 is prevented from being arranged excessively close to the edge 103. This, to some extent, addresses the problem of cracks of the solar cell due to stress concentration during the soldering, and is conducive to improving the reliability of the photovoltaic module.

In some embodiments, the solar cell is a back-contact solar cell. The back-contact solar cell refers to a solar cell where electrodes (first fingers and second fingers) of different polarities are all disposed on a back surface of the substrate.

In some embodiments, the substrate 100 may be made of an elemental semiconductor material. Specifically, the elemental semiconductor material is formed of a single element, for example, silicon or germanium. The elemental semiconductor material may be a monocrystalline state, a polycrystalline state, an amorphous state, or a microcrystalline (referred to as simultaneously having the monocrystalline state and the amorphous state). For example, silicon may be at least one of monocrystalline silicon, polycrystalline silicon, amorphous silicon, or microcrystalline silicon.

In some embodiments, the substrate 100 may also be made of a compound semiconductor material. Typical compound semiconductor materials include, but are not limited to, silicon germanium, silicon carbide, gallium arsenide, indium gallide, perovskite, cadmium telluride, copper indium selenium, or other materials. The substrate 100 may be a sapphire substrate, a silicon substrate on an insulator, or a germanium substrate on an insulator.

In some embodiments, the substrate 100 may be an N-type semiconductor substrate or a P-type semiconductor substrate. The N-type semiconductor substrate is doped with an N-type dopant element. The N-type dopant element may be any one of group V elements such as potassium (P), bismuth (Bi), antimony (Sb), arsenic (As), or the like. The P-type semiconductor substrate is doped with a P-type dopant element. The P-type dopant element may be any one of group III elements such as boron (B), aluminum (Al), gallium (Ga), indium (In), or the like.

In some embodiments, referring to FIG. 8 and FIG. 9, along a thickness direction of the substrate 100, that is, a third direction Z, the substrate 100 has a first surface 101 and a second surface 102 that are opposite to each other. The first surface 101 of the substrate 100 may be a back surface, and the second surface 102 of the substrate 100 may be a front surface. The front surface may serve as a light-receiving surface configured to receive incident light, and the back surface may serve as a backlight surface. The backlight surface is also capable of receiving incident light. However, the capability of receiving incident light by the backlight surface is poorer than the capability of receiving incident light by the light-receiving surface.

It should be noted that the incident light received by the light-receiving surface is light irradiated by the sun onto the solar cell, and the incident light received by the backlight surface is light reflected by the ground, reflected by another object, and reflected by a film layer on the substrate 100.

In some embodiments, a textured structure is arranged on the front surface of the substrate 100. The textured structure may include pyramid structures with a regular shape or black silicon with an irregular shape. An inclined surface of the textured structure increases the internal reflection of the incident light, such that the absorption and utilization rates of the incident light on the substrate 100 are improved, and hence the photoelectric conversion efficiency of the solar cell is enhanced.

In some embodiments, a front surface field (not illustrated) layer is formed on the front surface of the substrate 100, which has a conductivity type of dopant ions the same as that of dopant ions of the substrate 100, and thus reducing the concentration of the minority carriers on the surface by virtue of the field passivation effect. In this way, the recombination rate of the surface is reduced, and meanwhile, the series resistance is decreased, and the electron transportion capability is enhanced.

In some embodiments, the solar cell includes a front-surface passivation layer 320. The front-surface passivation layer 320 is disposed on the front surface, and the front-surface passivation layer 320 is considered as a front passivation layer. In some embodiments, the front-surface passivation layer 320 may be a single-layer structure, or a multilayer (laminated or stacked) structure. In some embodiments, the front-surface passivation layer 320 may be made of one or more of silicon oxide, silicon nitride, silicon oxynitride, silicon carbon oxynitride, titanium oxide, hafnium oxide, or aluminum oxide.

In some embodiments, the first surface 101 may be a polished surface. The polished surface refers to a flat surface formed by removing the textured structure on the surface by a polishing solution or by laser etching. The polished back surface has an increased flatness, and thus reflection of light of long wavelengths is enhanced. This promotes secondary absorption of the incident light, such that the short-circuit current is increased. In the meantime, since the specific surface area of the back surface is decreased, back surface recombination is reduced, and the passivation effect on the back surface is enhanced.

In some embodiments, the first doped portions and the second doped portions that are alternatingly arranged are arranged on the first surface 101. The first doped portions are doped with dopant ions having a conductivity type same as the substrate 100, and the second doped portions are doped with dopant ions having a conductivity type different from the substrate 100. For example, the substrate 100 is an N-type substrate, and the first doped portion is an N-type doped region, and the second doped portion is a P-type doped region, so that P-N junctions are formed between the second doped regions and the remaining substrate 100 other than the second doped regions to effectively shunt the carriers.

In some embodiments, a dopant concentration of the dopant ions in the first doped portions is greater than a dopant concentration of the dopant ions in the substrate 100, such that a high-low junction is formed between the first doped portion and the substrate 100, and thus the capability of diverting the carriers is enhanced.

In some embodiments, a gap or an isolator structure (not illustrated) is formed between the first doped portion and the second doped portion, or there is a height difference in the third direction between the first doped portion and the second doped portion, to implement automatic isolation between regions of different conductivity types. This may eliminate the impact on the cell efficiency due to current leakage caused by formation of a tunnel junction between heavily doped P and N regions on the back surface of the IBC cell.

In some embodiments, the solar cell includes a passivated contact structure. Hereinafter, description is given using a scenario where the first doped portion is doped with dopant ions having a conductivity type the same as that of the substrate 100 and the second doped portion is doped with dopant ions having a conductivity type different from that of the substrate 100 as an example.

In some embodiments, the first doped portion has a first passivated contact structure. The first passivated contact structure includes a first tunneling layer and a first doped conductive layer. The first tunneling layer is disposed between the substrate and the first doped portion. The first doped portion serves as the first doped conductive layer. A dopant concentration of the dopant ions in the first doped conductive layer is greater than a dopant concentration of the dopant ions in the substrate. The first passivated contact structure provides good surface passivation. The first tunneling layer may cause majority carriers to tunnel into the first doped conductive layer while blocking recombination of the minority carriers, such that the majority carriers is laterally transported in the first doped conductive layer and collected by metal electrodes. In this way, metal contact recombination current is greatly reduced, and open-circuit voltage and short-circuit current of the solar cell are improved.

In some embodiments, the first tunneling layer may be made of at least one of silicon oxide, silicon nitride, silicon oxynitride, silicon carbide, or magnesium fluoride.

In some embodiments, the first doped conductive layer may be made of at least one of amorphous silicon, polycrystalline silicon, or silicon nitride.

In some embodiments, the second doped portion has a second passivated contact structure. The second passivated contact structure includes a second tunneling layer and a second doped conductive layer. The second doped portion includes a second doped body, the second tunneling layer, and the second doped conductive layer that are successively arranged along a direction away from the substrate. The second doped body and the second doped conductive layer are both doped with dopant ions having a conductivity type different from that of the substrate. A dopant concentration of the doped ions in the second doped conductive layer is greater than a dopant concentration of the doped ions in the second doped body. The second passivated contact structure provides good surface passivation. The second tunneling layer may cause majority carriers to tunnel into the second doped conductive layer while blocking recombination of the minority carriers, such that the majority carriers is laterally transported in the second doped conductive layer and collected by metal electrodes. In this way, metal contact recombination current is greatly reduced, and open-circuit voltage and short-circuit current of the solar cell are improved.

In some embodiments, the second tunneling layer may be made of at least one of silicon oxide, silicon nitride, silicon oxynitride, silicon carbide, or magnesium fluoride.

In some embodiments, the second doped conductive layer may be made of at least one of amorphous silicon, polycrystalline silicon, or silicon nitride.

It should be noted that in some embodiments, both the first doped portion and the second doped portion may have a corresponding passivated contact structure; alternatively, one of the first doped portion and the second doped portion has a corresponding passivated contact structure, and the other of the first doped portion and the second doped portion does not have a corresponding passivated contact structure; alternatively, neither the first doped portion nor the second doped portion has a passivated contact structure.

Referring to FIG. 5, the first surface includes a central region I and edge regions II disposed on two opposite sides of the central region I along the second direction X. The edge regions II extend along the first direction Y, and the first direction Y is intersected with the second direction X. It should be noted that the edge regions II are the regions close to the edges 103 of the substrate 100, and the substrate 100 has two edges 103 arranged along the second direction X.

Referring to FIG. 5, the edge region II has first conductive doped portions 110 and second conductive doped portions 120 that are alternatingly arranged along the first direction Y. The first conductive doped portion 110 is one of a first doped region or a second doped region in the edge region II, and the second conductive doped portion 120 is the other of the first doped region or the second doped region in the edge region II. Within the same edge region II, the first conductive doped portion 110 has a conductivity type different from that of the second conductive doped portion 120. For example, within the same edge region II, the first conductive doped portion 110 may be an N-type doped region and the second conductive doped portion 120 may be a P-type doped region; or within the same edge region II, the first conductive doped portion 110 may be a P-type doped region and the second conductive doped region 120 may be an N-type doped region.

In the technical solutions according to the embodiments of the present disclosure, the N-type doped regions and the P-type doped regions in the edge regions II are alternatingly and evenly arranged. This prevents N-type doped regions or P-type doped regions having a large area in the edge regions II, and hence prevents carriers generated in the edge regions II from being collected by corresponding gridlines upon transportation by a long distance. In this way, the recombination loss caused by long-distance transportation is reduced, the short-circuit current is increased, the series resistance is decreased, the fill factor is improved, and eventually the photoelectric conversion efficiency of the solar cell is enhanced.

Referring to FIG. 5, the first conductive doped portion 110 includes a first doped portion 111 and second doped portions 112 disposed on two opposite sides of the first doped portion 111 along the second direction X. In some embodiments, the second doped portions 112 and the first doped portion 111 have the same conductive type within the same edge region II. It should be noted that within the same edge region II, in the case that the first conductive doped portion 110 is an N-type doped region and the second conductive doped portion 120 is a P-type doped region, the first doped portion 111 and the second doped portion 112 are both N-type doped regions, and the dopant concentration of the first doped portion 111 is greater than the dopant concentration of the second doped portion 112. It should be noted that within the same edge region II, in the case that the first conductive doped portion 110 is a P-type doped region and the second conductive doped portion 120 is an N-type doped region, the first doped portion 111 and the second doped portion 112 are both P-type doped regions, and the dopant concentration of the first doped portion 111 is greater than the dopant concentration of the second doped portion 112.

Configuring the dopant concentration of the first doped portion 111 to be greater is advantageous in that: during transportation of the carriers between the first sub-finger 211 and the second sub-finger 212, the first sub-finger 211 is electrically connected to the second sub-finger 212 via the first doped portion 111. The first doped portion 111 having a greater dopant concentration has a good carrier transportation capability, such that the resistance is decreased, the recombination loss during the transportation of the carriers is reduced, and hence the photoelectric conversion efficiency of the solar cell is enhanced.

Referring to FIG. 8 and FIG. 9, a passivation layer 130 is disposed on the first surface 101. The passivation layer 130 may be a single-layer film structure or a multilayer film structure, and the passivation layer 130 may be made of one or more of silicon oxide, silicon nitride, silicon oxynitride, silicon carbon oxynitride, titanium oxide, hafnium oxide, or aluminum oxide.

Referring to FIG. 6 to FIG. 9, the solar cell further includes a plurality of gridlines. The gridlines include a plurality of fingers extending through the passivation layer 130 along a thickness direction of the passivation layer 130, and a plurality of busbars disposed on a portion of the passivation layer 130 and a portion of the fingers. The plurality of fingers include a plurality of first fingers disposed in the first doped regions and a plurality of second fingers disposed in the second doped regions. The first fingers have a polarity different from the second fingers. The first fingers and the second fingers may be alternatingly arranged along the first direction Y. The first fingers and the second fingers all extend along the second direction X. The busbars include first busbars and second busbars that are alternatingly arranged along the second direction X. The first busbars have a polarity different from the second busbars. The first busbars and the second busbars all extend along the first direction Y. The first busbars are intersected with and connected to the first fingers, and the second busbars are intersected with and connected to the second fingers. Along the second direction X, a spacing is defined between the first finger and the second busbar, a spacing is defined between the second finger and the first busbar, the first finger is insulated from the second busbar, and the second finger is insulated from the first busbar.

It should be noted that in FIG. 6 and FIG. 7, the finger represented by a black-filled rectangle extending along the second direction X may be one of the first finger and the second finger, and the finger represented by a white-filled rectangle extending along the second direction may be the other of the first finger and the second finger. In FIG. 6 and FIG. 7, the busbar represented by a black-filled rectangle extending along the first direction Y may be one of the first busbar and the second busbar, and the busbar represented by a white-filled rectangle extending along the first direction Y may be the other of the first busbar and the second busbar. The finger represented by the black-filled rectangle and the busbar represented by the black-filled rectangle are gridlines having the same polarity, and the finger represented by the white-filled rectangle and the busbar represented by the white-filled rectangle are gridlines having the same polarity.

In some embodiments, the first finger and the second finger may be sintered from a burn-through slurry. In some embodiments, the first finger may be made of one or more of aluminum, silver, gold, nickel, molybdenum, or copper. In some embodiments, the second finger may be made of one or more of aluminum, silver, gold, nickel, molybdenum, or copper.

In some embodiments, the first busbar and the second busbar may be sintered from a non-burn-through slurry. The first busbar and the second busbar are disposed on a surface, away from the substrate 100, of the passivation layer 130. In this way, there is no need to design layout of the first doped region and the second doped region, such that electrical contact between the first busbar and the second doped region is prevented, electrical contact between the second busbar and the first doped region is prevented, and hence short circuit is avoided. In addition, the first busbar and the second busbar may not cause any damage to the passivation layer, such that integrity of the film layer of the passivation layer is ensured, and hence a passivation effect of the passivation layer to the substrate 100 is enhanced. In this way, optical loss of the solar cell is reduced, and hence the photoelectric conversion efficiency is enhanced. In addition, since the non-burn-through slurry does not have much glass powder which may cause damages to the PN junction, metal recombination may be effectively reduced, the open-circuit voltage of the solar cell is increased, and the photoelectric conversion efficiency of the solar cell is enhanced.

Referring to FIG. 6 to FIG. 9, with respect to the same edge region II, one of the first finger and the second finger disposed in the edge region II is the first edge finger 210, and the other of the first finger and the second finger disposed in the edge region II is the second edge finger 210. Along the third direction, the second edge finger 220 is disposed on the corresponding second conductive doped portion 120. The first edge finger 210 includes a first sub-finger 211 and a second sub-finger 212 that are spaced apart along the direction away from the central region I. Along the third direction, at least a portion of the first sub-finger 211 is disposed on the second doped portion 112 on a side, close to the central region I, of the first doped portion 111, and at least a portion of the second sub-finger 212 is disposed on the second doped portion disposed on a side, close to the edge 103 of the first doped portion 111. As such, with respect to one of the first edge fingers 210, the second sub-finger 212 is connected to the first sub-finger via the first doped portion 111. In this way, the carriers collected by the second sub-finger 212 may be transported to the first sub-finger 211 via the first doped portion 111, and the carriers collected by the first sub-finger 211 are collected by the busbar connected to the first sub-finger 211, such that the problem that where the carriers collected by the second sub-finger 212 fail to be collected by the busbar is addressed.

Referring to FIG. 6 to FIG. 9, the edge busbar 310 is a busbar disposed in the edge region II, and the edge busbar 310 is a busbar closest to the edge 103. In some embodiments, the first doped portion 111 has a conductivity type different from the edge busbar 310. Along the third direction Z, the edge busbar 310 is disposed on a portion of the passivation layer 130 and a portion of the second edge finger 220, and the edge busbar 310 is connected to the second edge finger 220 and configured to collect the carriers collected by the second edge finger 220. Along the third direction Z, the edge busbar 310 is disposed over the first doped portion 111, the passivation layer 130 is arranged between the edge busbar 310 and the first doped portion 111, and the edge busbar 310 is insulated from the first doped portion 111.

In some embodiments, along the thickness direction (the third direction Z) of the first conductive doped portion, an orthographic projection of the first sub-finger 211 on the first surface 101 is overlapped with a portion of the second doped portion 112 and a portion of the first doped portion 111, and/or, an orthographic projection of the second sub-finger 212 on the first surface 101 is overlapped with a portion of the second doped portion 112 and a portion of the first doped portion 111. That is, along the third direction Z, a portion of the first sub-finger 211 is also disposed on the first doped portion 111 for connecting the first sub-finger 211 and the second sub-finger 212 thereof, and a portion of the second sub-finger 212 is also disposed on the first doped portion 111 for connecting the second sub-finger 212 and the first sub-finger 211. As such, the first sub-finger 211 and the second sub-finger 212 are both directly connected to the first doped portion 111. This is conducive to improving the transportation efficiency of the carriers between the first sub-finger 211 and the second sub-finger 212, decreasing the resistance, reducing the recombination loss during transportation of the carriers, and improving the photoelectric conversion efficiency of the solar cell.

In some embodiments, along the second direction X, a spacing between the edge busbar 310 and the first sub-finger 211 may be in the range of 50 μm to 100 μm, for example, 55 μm, 56 μm, 60 μm, 70 μm, or 86 μm. And/or, a spacing between the edge busbar 310 and the second sub-finger 212 may be in the range of 50 μm to 100 μm, for example, 55 μm, 56 μm, 60 μm, 70 μm, or 86 μm. Along the second direction X, in the case that the spacing between the edge busbar 310 and the first sub-finger 211 is excessively small, the edge busbar 310 may be connected to the first sub-finger 211 having a polarity different from the edge busbar 310, and consequently the performance of the solar cell is affected. Similarly, along the second direction X, in the case that the spacing between the edge busbar 310 and the second sub-finger 212 is excessively small, the edge busbar 310 may be connected to the second sub-finger 212 having a polarity different from the edge busbar 310, and consequently the performance of the solar cell is affected. Along the second direction X, in the case that the spacing between the edge busbar 310 and the first sub-finger 211 is excessively large, and/or, the spacing between the edge busbar 310 and the second sub-finger 212 is excessively large, a spacing between the first sub-finger 211 and the second sub-finger 212 may be larger, and consequently the transportation distance of the carriers is increased, and the recombination loss is increased. Therefore, configuring the spacing between the edge busbar 310 and the first sub-finger 211 to be in the range of 50 μm to 100 μm, and/or, configuring the spacing between the edge busbar 310 and the second sub-finger 212 to be in the range of 50 μm to 100 μm is not only conducive to ensuring mutual insulation between the grid-lines having different polarities, but also conducive to preventing a greater recombination loss.

In some embodiments, along the second direction X, the spacing between the edge busbar 310 and the first sub-finger 211 may be in the range of 50 μm to 60 μm. In some embodiments, along the second direction X, the spacing between the edge busbar 310 and the first sub-finger 211 may be in the range of 60 μm to 70 μm. In some embodiments, along the second direction X, the spacing between the edge busbar 310 and the first sub-finger 211 may be in the range of 70 μm to 80 μm. In some embodiments, along the second direction X, the spacing between the edge busbar 310 and the first sub-finger 211 may be in the range of 80 82 m to 90 μm. In some embodiments, along the second direction X, the spacing between the edge busbar 310 and the first sub-finger 211 may be in the range of 90 μm to 100 μm.

In some embodiments, along the second direction X, the spacing between the edge busbar 310 and the second sub-finger 212 may be in the range of 50 μm to 60 μm. In some embodiments, along the second direction X, the spacing between the edge busbar 310 and the second sub-finger 212 may be in the range of 60 μm to 70 μm. In some embodiments, along the second direction X, the spacing between the edge busbar 310 and the second sub-finger 212 may be in the range of 70 μm to 80 μm. In some embodiments, along the second direction X, the spacing between the edge busbar 310 and the second sub-finger 212 may be in the range of 80 μm to 90 μm. In some embodiments, along the second direction X, the spacing between the edge busbar 310 and the second sub-finger 212 may be in the range of 90 μm to 100 μm.

In some embodiments, the edge region II has an edge 103 distant from the central region I. Along the second direction X, a spacing between the edge busbar 310 and the edge 103 may be in the range of 2 mm to 5 mm, for example, 2 mm, 3 mm, 4 mm, 4.5 mm, or 5 mm. It should be noted that the spacing range is the spacing between the edge busbar 310 and the edge 103 adjacent to the edge busbar 310. Since the edge 103 of the cell originally has micro cracks, in the case that the edge busbar 310 is too close to the edge 103, then during the subsequent process of forming the photovoltaic module, stress concentration may be caused during soldering the edge busbar 310 to the solder stripe, leading to an increased probability of cracking problems. In the case that the edge busbar 310 is too far away from the edge 103, then along the second direction X, when the carriers collected by the second sub-fingers 212 positioned between the edge busbar 310 and the edge 103 adjacent to the edge busbar 310 are collected by the edge busbar 310, a relatively long transportation distance is caused. Therefore, the spacing between the edge busbar 310 and the edge 103 adjacent to the edge busbar 310 is defined to be in a range of 2 mm to 5 mm, which is not only conducive to reducing the possibility of cracking during the soldering and enhancing the reliability of the photovoltaic module, but also conducive to ensuring that the edge busbar 310 has a superior carrier collection capability.

In some embodiments, along the second direction X, the spacing between the edge busbar 310 and the edge 103 may be in the range of 2 mm to 3 mm. In some embodiments, along the second direction X, the spacing between the edge busbar 310 and the edge 103 may be in the range of 3 mm to 4 mm. In some embodiments, along the second direction X, the spacing between the edge busbar 310 and the edge 103 may be in the range of 4 mm to 5 mm.

In some embodiments, along the second direction X, a size of the first doped portion 111 is greater than a size of the edge busbar 310. In this way, along the second direction X, sufficient spacings are ensured between the first sub-finger 211 and the second sub-finger 212 on the second doped portions 112 that are disposed on two opposite sides of the first doped portion 111, and further it is ensured that the first sub-finger 211 and the second sub-fingers 212 are both close to the first doped portion 111. This is conducive to improving the capabilities of the first sub-finger 211 and the second sub-finger 212 in transporting the carriers via the first doped portion 111.

In some embodiments, a ratio of the dopant concentration of the first doped portion 111 to the dopant concentration of the second doped portion 112 is in the range of 2 to 10. For example, the ratio may be 3, 4, 5, 7, or 9.

In some embodiments, the ratio of the dopant concentration of the first doped portion 111 to the dopant concentration of the second doped portion 112 is in the range of 5 to 10. For example, the ratio may be 5, 6, 7, 8, or 8.5. In the case that the dopant concentration of the first doped portion 111 is excessively low, the transportation efficiency of the carriers between the second sub-finger 212 and the first sub-finger 211 fails to be effectively improved. In the case that the dopant concentration of the first doped portion 111 is excessively high, the dopant ions in the first doped portion 111 are more likely to diffuse into the second doped portion 112, and consequently the performance of the second doped portion 112 is greatly affected. Therefore, defining the ratio of the dopant concentration of the first doped portion 111 to the dopant concentration of the second doped portion 112 to be in the range of 5 to 10 is not only conducive to improving the transportation efficiency of the carriers, but also conducive to preventing the first doped portion 111 from causing a greater impact onto the performance of the second doped portion 112.

In some embodiments, the ratio of the dopant concentration of the first doped portion 111 to the dopant concentration of the second doped portion 112 is in the range of 5 to 6. In some embodiments, the ratio of the dopant concentration of the first doped portion 111 to the dopant concentration of the second doped portion 112 is in the range of 6 to 7. In some embodiments, the ratio of the dopant concentration of the first doped portion 111 to the dopant concentration of the second doped portion 112 is in the range of 7 to 8. In some embodiments, the ratio of the dopant concentration of the first doped portion 111 to the dopant concentration of the second doped portion 112 is in the range of 8 to 9. In some embodiments, the ratio of the dopant concentration of the first doped portion 111 to the dopant concentration of the second doped portion 112 is in the range of 9 to 10.

In some embodiments, the first conductive doped portion 110 is a P-type doped region, and the dopant concentration of the second doped portion 112 may be in the range of $0.9\times10^{19}/cm^3$ to $2.2\times10^{19}/cm^3$, for example, $0.91\times10^{19}/cm^3$, $0.93\times10^{19}/cm^3$, $0.95\times10^{19}/cm^3$, $1\times10^{19}/cm^3$, or $2\times10^{19}/cm^3$.

In some embodiments, the first conductive doped portion 110 is a P-type doped region. In some examples, the dopant concentration of the second doped portion 112 may be in the range of $0.9\times10^{19}/cm^3$ to $1.5\times10^{19}/cm^3$. In some examples, the dopant concentration of the second doped portion 112 may be in the range of $1.5\times10^{19}/cm^3$ to $2\times10^{19}/cm^3$. In some examples, the dopant concentration of the second doped portion 112 may be in the range of $2\times10^{19}/cm^3$ to $2.5\times10^{19}/cm^3$.

In some embodiments, the first conductive doped portion 110 is an N-type doped region, and the dopant concentration of the second doped portion 112 may be in the range of $0.9\times10^{20}/cm^3$ to $2.2\times10^{20}/cm^3$, for example, $0.91\times10^{20}/cm^3$, $0.93\times10^{20}/cm^3$, $0.95\times10^{20}/cm^3$, $1\times10^{20}/cm^3$, or $2\times10^{20}/cm^3$.

In some embodiments, the first conductive doped portion 110 is an N-type doped region. In some examples, the dopant concentration of the second doped portion 112 may be in the range of $0.9\times10^{20}/cm^3$ to $1.5\times10^{20}/cm^3$. In some examples, the dopant concentration of the second doped portion 112 may be $1.5\times10^{20}/cm^3$ to $2\times10^{20}/cm^3$. In some examples, the dopant concentration of the second doped portion 112 may be $2\times10^{20}/cm^3$ to $2.5\times10^{20}/cm^3$.

In some embodiments, the first conductive doped portion 110 is a P-type doped region, and the dopant concentration of the first doped portion 111 may be in the range of $0.9\times10^{20}/cm^3$ to $1.1\times10^{20}/cm^3$, for example, $0.91\times10^{20}/cm^3$, $0.93\times10^{20}/cm^3$, $0.95\times10^{20}/cm^3$, $1\times10^{20}/cm^3$, or $1.1\times10^{20}/cm^3$.

In some embodiments, the first conductive doped portion 110 is a P-type doped region, and the dopant concentration of the first doped portion 111 may be in the range of $0.9\times10^{20}/cm^3$ to $1\times10^{20}/cm^3$. In some embodiments, the first conductive doped portion 110 is a P-type doped region, and the dopant concentration of the first doped portion 111 may be in the range of $1\times10^{20}/cm^3$ to $1.1\times10^{20}/cm^3$.

In some embodiments, the first conductive doped portion 110 is an N-type doped region, and the dopant concentration of the first doped portion 111 may be in the range of $0.9\times10^{21}/cm^3$ to $1.1\times10^{21}/cm^3$, for example, $0.91\times10^{21}/cm^3$, $0.93\times10^{21}/cm^3$, $0.95\times10^{21}/cm^3$, $1\times10^{21}/cm^3$, or $1.1\times10^{21}/cm^3$.

In some embodiments, the first conductive doped portion 110 is an N-type doped region, and the dopant concentration of the first doped portion 111 may be in the range of $0.9\times10^{21}/cm^3$ to $1\times10^{21}/cm^3$. In some embodiments, the first conductive doped portion 110 is an N-type doped region, and the dopant concentration of the first conductive doped portion 110 may be in the range of $1\times10^{21}/cm^3$ to $1.1\times10^{21}/cm^3$.

It should be noted that the dopant concentration involved in the embodiments of the present disclosure may be a dopant concentration measured from surfaces of corresponding film layers.

Figure 10:
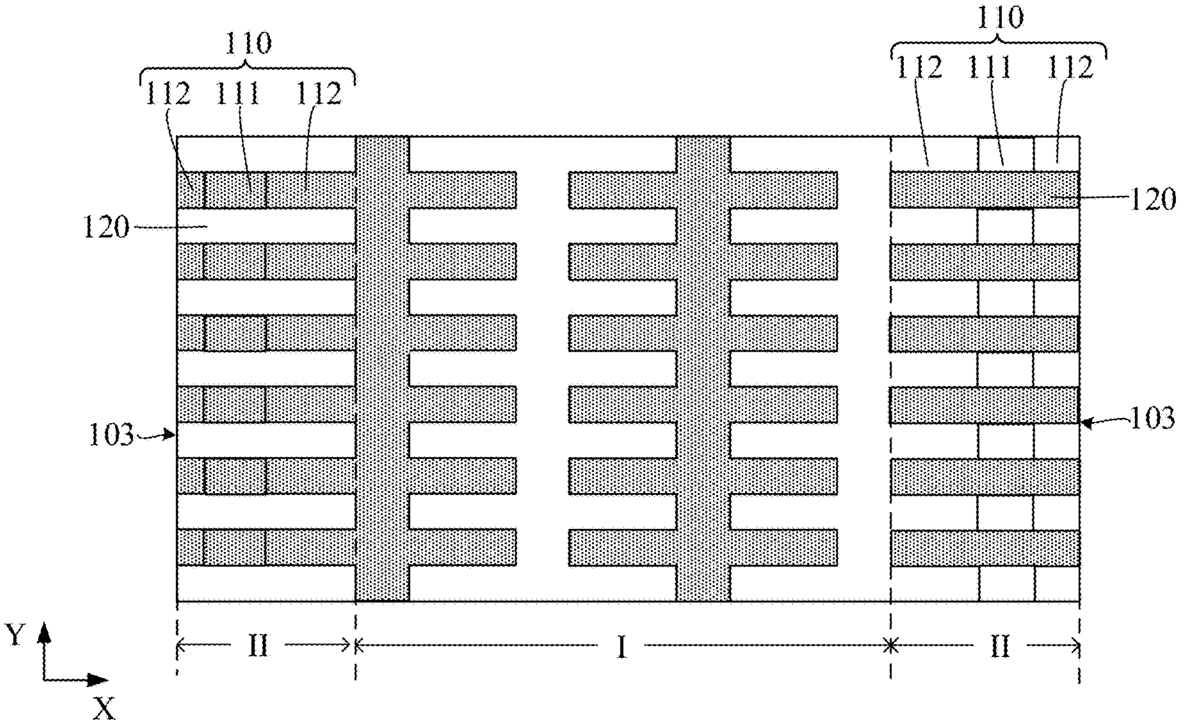
FIG. 10 is a schematic diagram illustrating a top view of a first surface of a solar cell according to some embodiments of the present disclosure.
Figure 11:
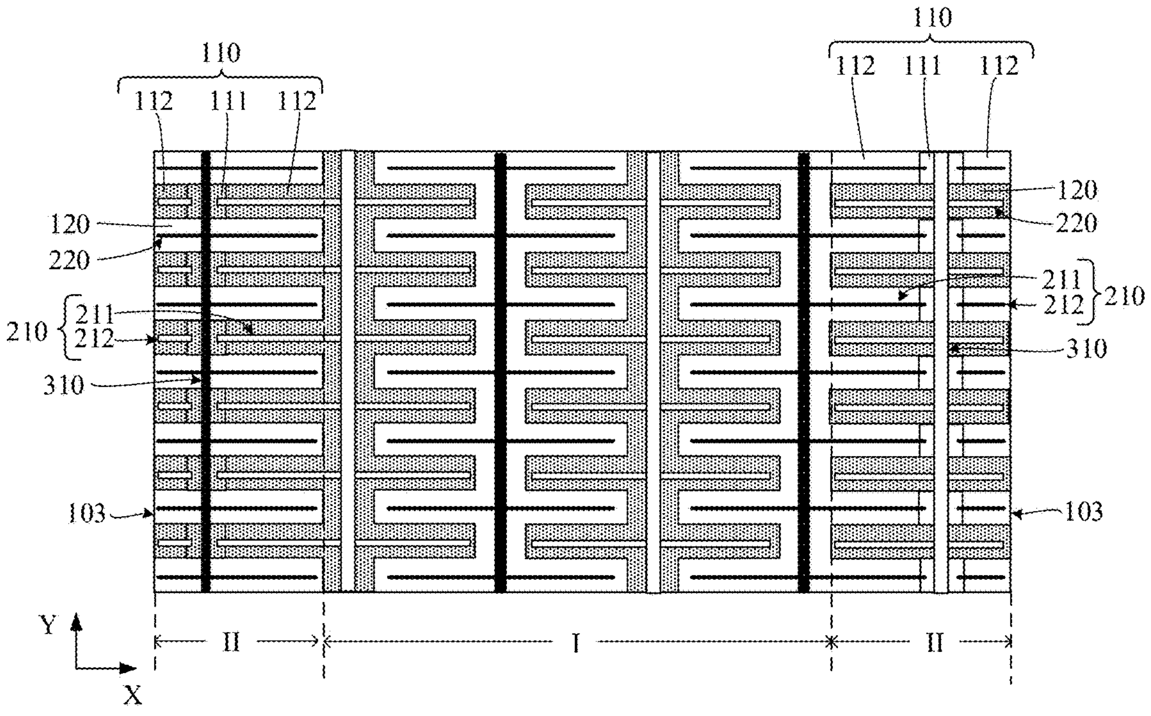
FIG. 11 is a schematic structural diagram of a back surface of another solar cell according to some embodiments of the present disclosure.
Figure 12:
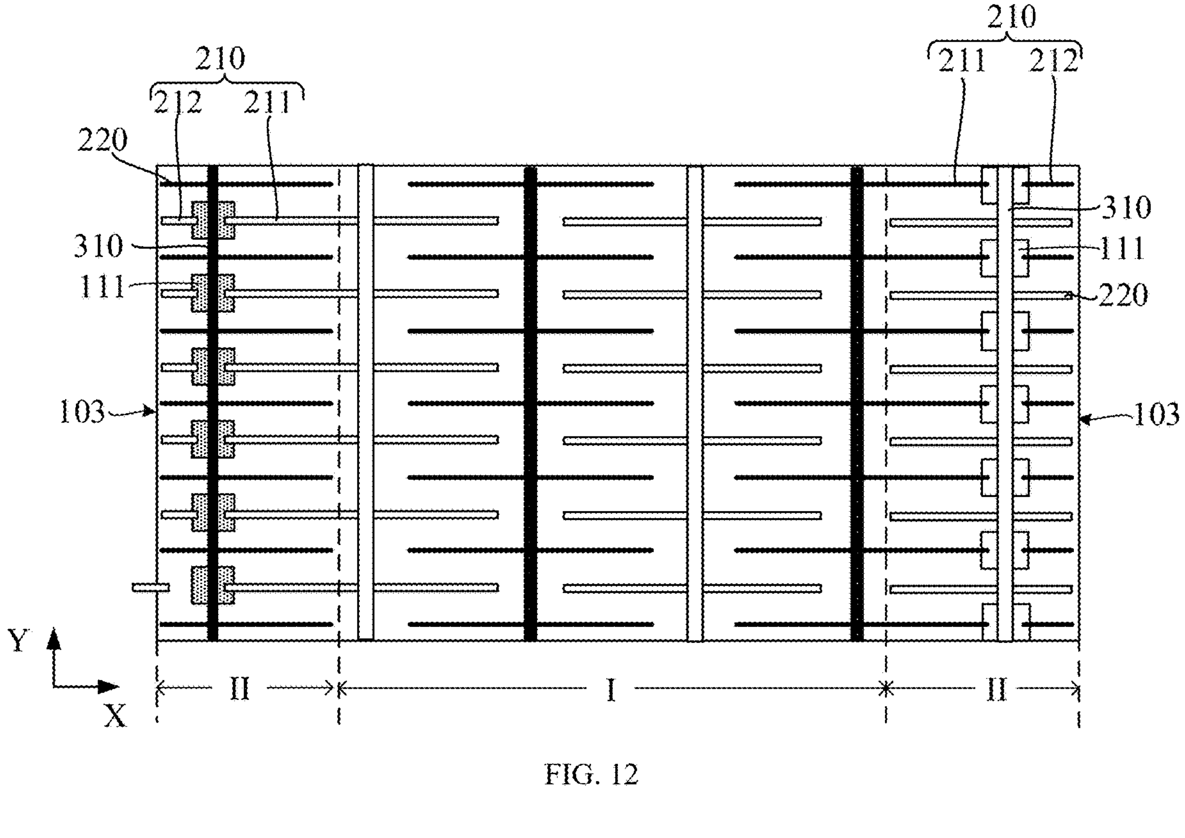
FIG. 12 is a schematic structural diagram of back gridlines of another solar cell according to some embodiments of the present disclosure.

FIG. 10 is a schematic diagram illustrating a top structure of a first surface of another solar cell according to some embodiments of the present disclosure. FIG. 11 is a schematic structural diagram of a back surface of another solar cell according to some embodiments of the present disclosure. FIG. 12 is a schematic structural diagram of back gridlines of another solar cell according to some embodiments of the present disclosure.

Referring to FIG. 5 to FIG. 7, and FIG. 10 to FIG. 12, in some embodiments, the two edge regions II disposed on two sides of the central region I are respectively a first edge region and a second edge region. The first conductive doped portion 110 in the first edge region II has a conductivity type different from or the same as that of the first conductive doped portion 110 in the second edge region II. That is, the polarities of different edge busbars 310 adjacent to different edges 103 may be the same or different. In some examples, referring to FIG. 6 and FIG. 7, the edge busbar 310 adjacent to the edge 103 on one side of the substrate 100 is a first busbar, and the edge busbar 310 close to the edge 103 on the other side of the substrate 100 is also a first busbar; or, the edge busbar 310 close to the edge 103 on one side of the substrate 100 is a second busbar, and the edge busbar 310 adjacent to the edge 103 on the other side of the substrate 100 is also a second busbar. In some embodiments, referring to FIG. 11 and FIG. 12, the edge busbar 310 close to the edge 103 on one side of the substrate 100 is a first busbar, and the edge busbar 310 close to the edge 103 on the other side of the substrate 100 is a second busbar; or, the edge busbar 310 close to the edge 103 on one side of the substrate 100 is a second busbar, and the edge busbar 310 close to the edge 103 on the other side of the substrate 100 is a first busbar.

In the embodiments of the present disclosure, the polarities of the edge busbars 310 adjacent to the edges 103 are not restricted as long as the first busbars and the second busbars are alternately arranged, and the edge busbar 310 may be either the first busbar or the second busbar.

Figure 13:
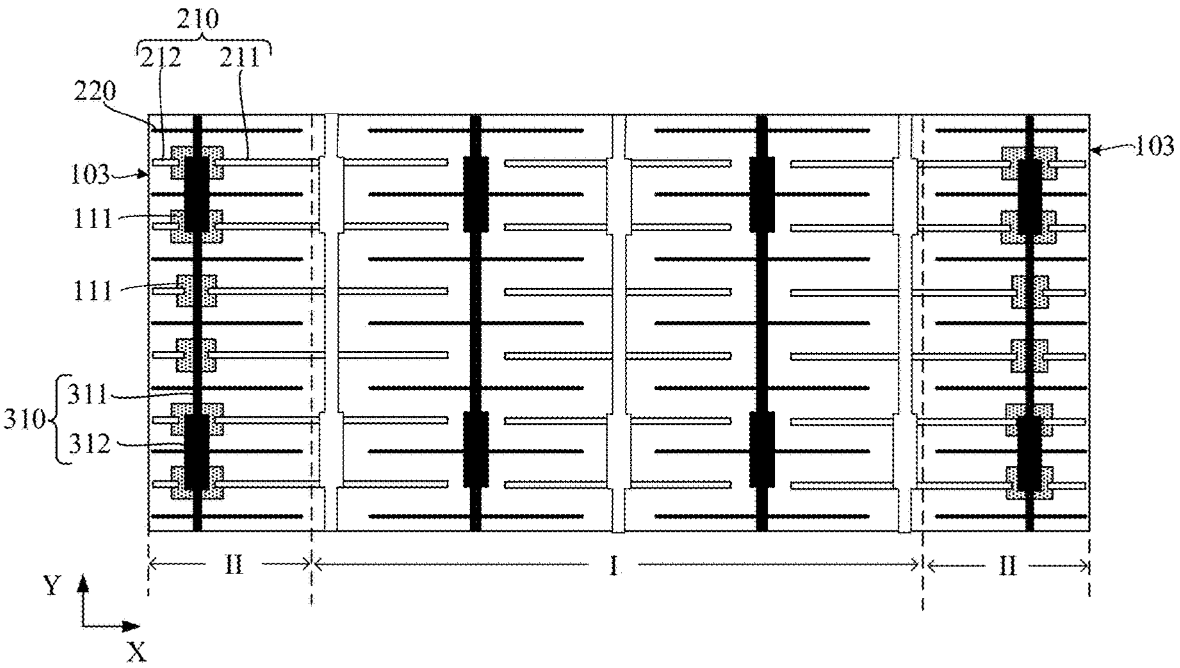
FIG. 13 is a schematic structural diagram of back gridlines of a further solar cell according to some embodiments of the present disclosure.

FIG. 13 is a schematic structural diagram of back gridlines of a further solar cell according to some embodiments of the present disclosure.

Referring to FIG. 13, in some embodiments, the edge busbar 310 includes a busbar body 311 and a solder portion 312 that are arranged along the first direction Y. The busbar body 311 extends along the first direction Y. Along the second direction X, a size of the solder portion 312 is greater than a size of the busbar body 311. As such, the busbar body 311 and the solder portion 312 are arranged along the first direction Y. In this way, compared with the staggered arrangement as illustrated in FIG. 3, such arrangement herein is conducive to lowering the difficulty in soldering the solder strip on the edge busbar 310.

Referring to FIG. 13, in some embodiments, along the second direction X, since the size of the busbar body 311 is smaller than the size of the solder portion 312, correspondingly, a size of the first doped portion 111 under the busbar body 311 along the second direction X is smaller than a size of the first doped portion 111 under the solder portion 312 along the second direction X. In this way, it is conducive to preventing the first sub-finger 211 or the second sub-finger 212 from being connected to the solder portion 312.

Figure 14:
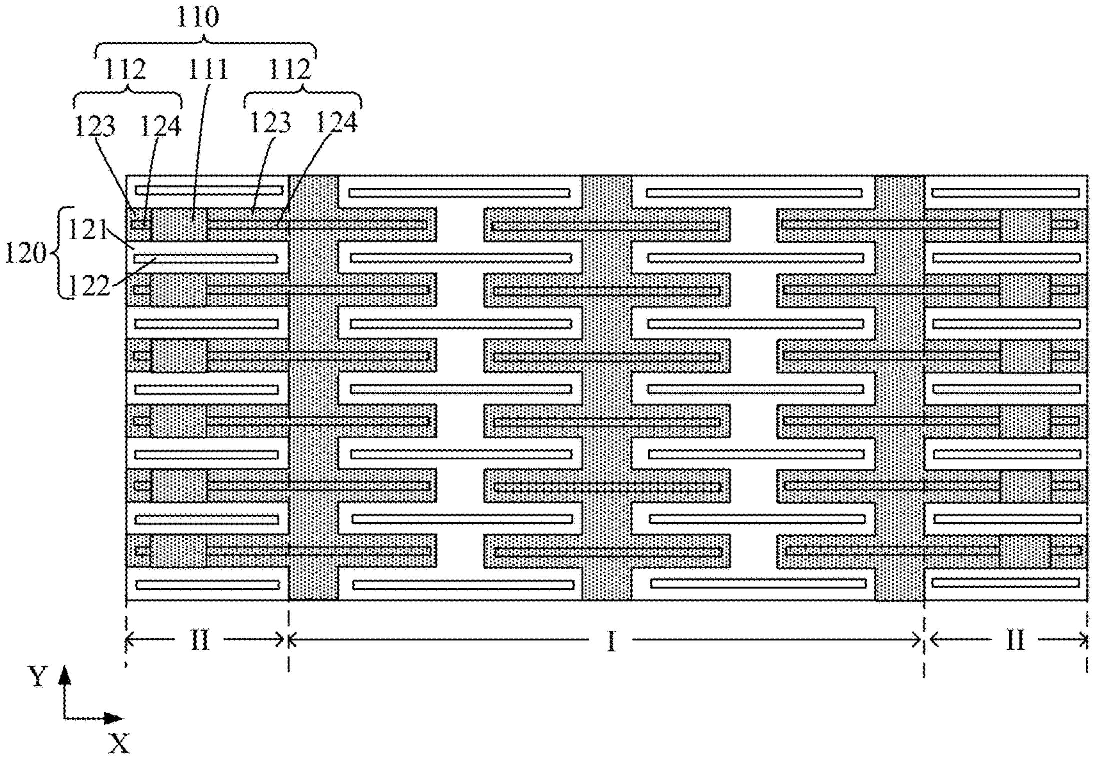
FIG. 14 is a schematic diagram illustrating a top view of a first surface of yet another solar cell according to some embodiments of the present disclosure.

FIG. 14 is a schematic diagram illustrating a top view of a first surface of yet another solar cell according to some embodiments of the present disclosure.

Referring to FIG. 14, in some embodiments, each of the second doped portions 112 includes a first portion 123 and a second portion 124. Along the third direction, the first edge finger is disposed on the second portion 124. A dopant concentration of the second portion 124 is greater than a dopant concentration of the first portion 123. The second portion 124 serves as a selective emitter. In this way, the contact resistance between the first edge finger and the second doped portion 112 is decreased, the recombination of the carriers is reduced, the output voltage and current of the solar cell are increased, and hence the photoelectric conversion efficiency of the solar cell is enhanced.

In some embodiments, the first conductive doped portion 110 is a P-type doped region, and the dopant concentration of the first portion 123 may be in the range of $0.5\times10^{19}/cm^3$ to $1.1\times10^{19}/cm^3$, for example, $0.6\times10^{19}/cm^3$, $0.7\times10^{19}/cm^3$, $0.75\times10^{19}/cm^3$, $1\times10^{19}/cm^3$, or $1.1\times10^{19}/cm^3$. In some embodiments, the first conductive doped portion 110 is a P-type doped region, and the dopant concentration of the second portion 124 may be in the range of $1.5\times10^{19}/cm^3$ to $3\times10^{19}/cm^3$, for example, $1.71\times10^{19}/cm^3$, $1.83\times10^{19}/cm^3$, $1.95\times10^{19}/cm^3$, $2\times10^{19}/cm^3$, or $2.5\times10^{19}/cm^3$.

In some embodiments, the first conductive doped portion 110 is an N-type doped region, and the dopant concentration of the first portion 123 may be in the range of $0.5\times10^{20}/cm^3$ to $1.1\times10^{20}/cm^3$, for example, $0.6\times10^{20}/cm^3$, $0.7\times10^{20}/cm^3$, $0.75\times10^{20}/cm^3$, $1\times10^{20}/cm^3$, or $1.1\times10^{20}/cm^3$. In some embodiments, the first conductive doped portion 110 is an N-type doped region, and the dopant concentration of the second portion 124 may be in the range of $1.5\times10^{20}/cm^3$ to $3\times10^{20}/cm^3$, for example, $1.71\times10^{20}/cm^3$, $1.83\times10^{20}/cm^3$, $1.95\times10^{20}/cm^3$, $2\times10^{20}/cm^3$, or $2.5\times10^{20}/cm^3$.

Referring to FIG. 14, in some embodiments, each of the second conductive doped portions 120 includes a third portion 121 and a fourth portion 122. Along the third direction, the second edge finger is disposed on the fourth portion 122. A dopant concentration of the fourth portion 122 is greater than a dopant concentration of the third portion 121. The fourth portion 122 serves as a selective emitter. In this way, the contact resistance between the second edge finger and the second conductive doped portion 120 is decreased, the recombination of the carriers is reduced, the output voltage and current of the solar cell are increased, and hence the photoelectric conversion efficiency of the solar cell is significantly enhanced.

In some embodiments, the second conductive doped portion 120 is a P-type doped region, and the dopant concentration of the third portion 121 may be in the range of $0.5\times10^{19}/cm^3$ to $1.1\times10^{19}/cm^3$, for example, $0.6\times10^{19}/cm^3$, $0.7\times10^{19}/cm^3$, $0.75\times10^{19}/cm^3$, $1\times10^{19}/cm^3$, or $1.1\times10^{19}/cm^3$. In some embodiments, the second conductive doped portion 120 is a P-type doped region, and the dopant concentration of the fourth portion 122 may be in the range of $1.5\times10^{19}/cm^3$ to $3\times10^{19}/cm^3$, for example, $1.71\times10^{19}/cm^3$, $1.83\times10^{19}/cm^3$, $1.95\times10^{19}/cm^3$, $2\times10^{19}/cm^3$, or $2.5\times10^{19}/cm^3$.

In some embodiments, the second conductive doped portion 120 is an N-type doped region, and the dopant concentration of the third portion 121 may be in the range of $0.5\times10^{20}/cm^3$ to $1.1\times10^{20}/cm^3$, for example, $0.6\times10^{20}/cm^3$, $0.7\times10^{20}/cm^3$, $0.75\times10^{20}/cm^3$, $1\times10^{20}/cm^3$, or $1.1\times10^{20}/cm^3$. In some embodiments, the second conductive doped portion 120 is an N-type doped region, and the dopant concentration of the fourth portion 122 may be in the range of $1.5\times10^{20}/cm^3$ to $3\times10^{20}/cm^3$, for example, $1.71\times10^{20}/cm^3$, $1.83\times10^{20}/cm^3$, $1.95\times10^{20}/cm^3$, $2\times10^{20}/cm^3$, or $2.5\times10^{20}/cm^3$.

In some embodiments, the solar cell further includes an anti-reflective layer (not illustrated). The anti-reflective layer is disposed on a side, away from the back surface, of the passivation layer 130 and on a side, away from the substrate 100, of the front-surface passivation layer 130. The first finger extends through the anti-reflective layer and the passivation layer 130 and is in electrical contact with a surface of the first doped region, and the second finger extends through the anti-reflective layer and the passivation layer 130 and is in electrical contact with a surface of the second doped region. The anti-reflective layer has a relatively high refractive index, and is capable of reducing reflection loss on the back surface of the cell. The anti-reflective layer may be made of any one or more of silicon nitride or silicon oxynitride.

In the solar cell according to the above embodiments, the carriers collected by the first sub-fingers in the edge regions may be collected by the busbar disposed in the central region and having the same polarity as the first sub-fingers. Since the first sub-finger is disconnected from the second sub-finger, and the edge busbar with a different polarity is disposed between the first sub-finger and the second sub-finger, the carriers collected by the second sub-finger disposed in the edge region may be transported to the first sub-finger with a larger dopant concentration and are then collected by the busbar connected to the first sub-finger. As such, the presence of the edge busbar does not necessarily affect arrangement of the first edge finger between the edge busbar and the edge adjacent to the edge busbar, which avoids arranging a second conductive doped portion with a larger area at the edge, and implements alternate arrangement of the first conductive doped portions and the second conductive doped portions in the edge region. The carriers of the first conductive doped portion and the second conductive doped portion in the edge region are collected by using the corresponding sub-fingers, which reduces the recombination loss during transportation of the carriers. In addition, a specific spacing may be defined between the edge busbar and the edge, to prevent the edge busbar from being arranged too close to the edge. During soldering of the edge busbar and the solder strip, the problem of cracking caused by the stress concentration is mitigated, which is conducive to improving the structural reliability of the solar cells.

Figure 15:
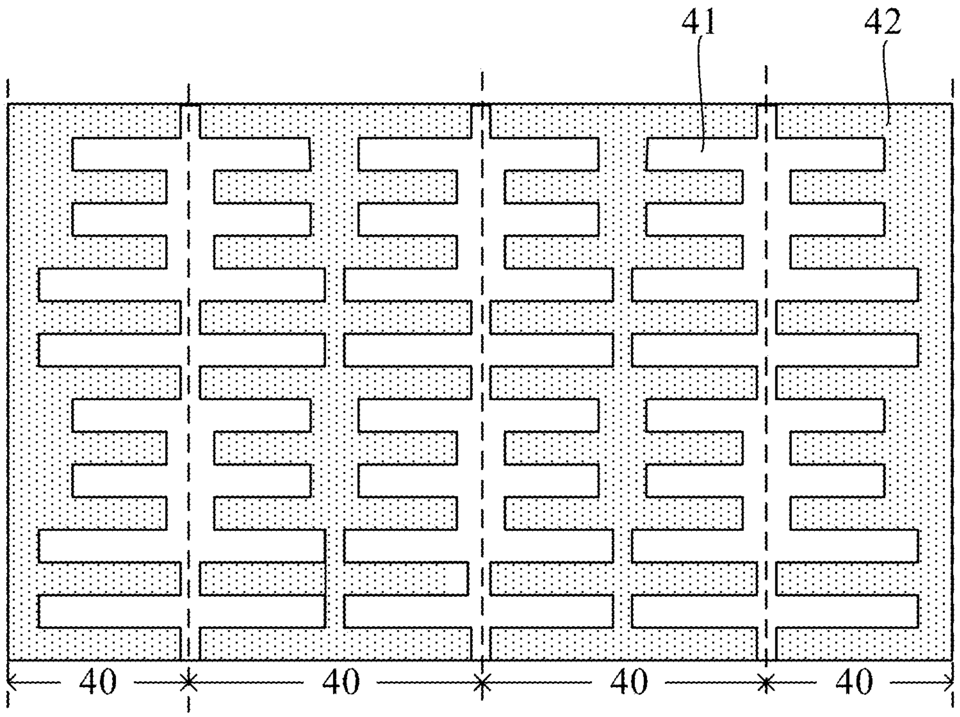
FIG. 15 is a schematic structural diagram of a doped region on a back surface of a solar cell in the related art.
Figure 16:
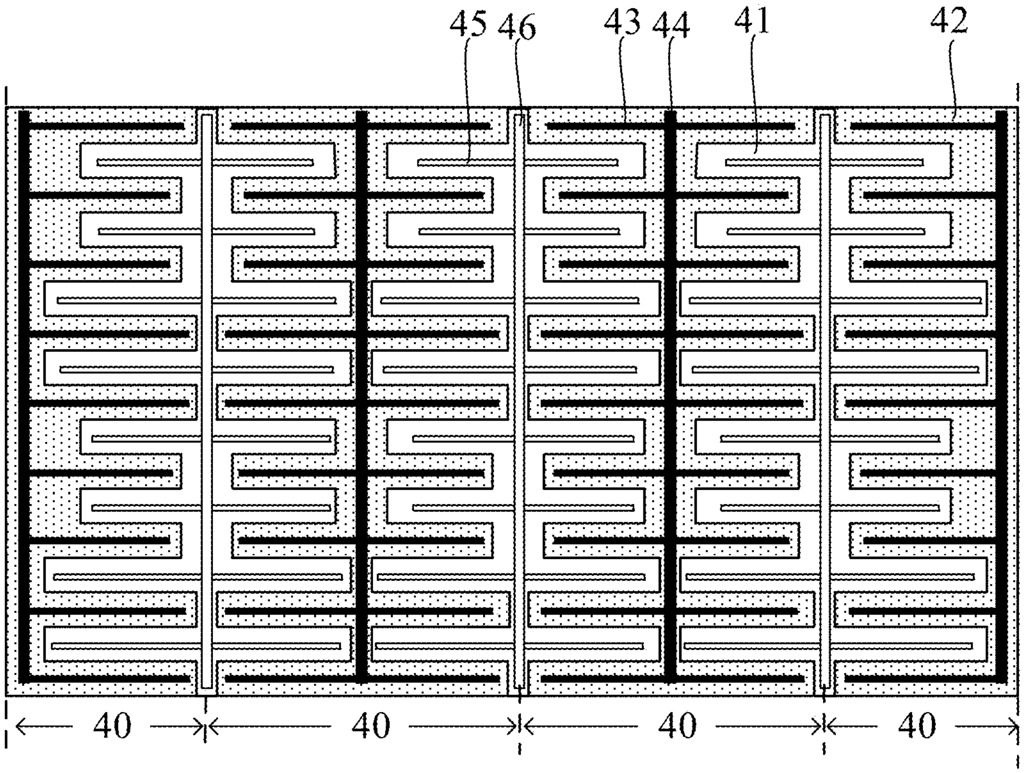
FIG. 16 is a schematic structural diagram of a back surface of a solar cell in the related art.

FIG. 15 is a schematic structural diagram of a doped region on a back surface of a solar cell in the related art. FIG. 16 is a schematic structural diagram of a back surface of a solar cell in the related art.

Referring to FIG. 15 and FIG. 16, in the back electrode pattern of a conventional back-contact solar cell, the design that fingers are employed to connect busbars of the same polarity, and the fingers breaks at busbars of an opposite polarity is typically employed. For example, positive fingers 45 break at negative busbars 44, and negative fingers 43 break at positive busbars 46. Correspondingly, the back surface of the substrate includes P-type doped regions 41 and N-type doped regions 42. The positive fingers 45 and the positive busbars 46 are disposed in the corresponding P-type doped regions 41, and the negative fingers 43 and the negative busbars 44 are disposed in the corresponding N-type doped regions 42. The P-type doped regions 41 corresponding to different positive busbars 46 are independent of one another, the N-type doped regions 42 corresponding to different negative busbars 44 are independent of one another, and the fingers corresponding to different busbars are also independent of each other. For example, the N-type doped regions 42 on two sides of the dotted lines are disconnected from one another, the negative fingers 43 and the negative busbars 44 on two sides of the dotted lines are disconnected from one another. In such a design, an entire back-contact solar cell may be divided into a plurality of strip-shaped independent cell regions 40 that are nearly non-contiguous. In this case, non-uniformity of the performance of the cells or local anomalies of the cells may cause different strip-shaped independent cell regions 40 to exhibit different brightness levels during subsequent EL testing, resulting in module mismatch and reduced power of the photovoltaic module.

To address the above problem, some embodiments of the present disclosure provide a solar cell and a photovoltaic module. In the solar cell, along a second direction, first portions on two opposite sides of a second busbar are connected via a second portion having a relatively higher dopant concentration under the second busbar, such that the problem that the cell regions on two sides of the second busbar exhibit different brightness levels during the EL testing due to the non-uniformity of the performance of the cells within regions on two sides of the second busbar or the local anomalies of the cells within regions on one side of the second busbar along the second direction is addressed. In this way, reduction of the module mismatch is facilitated, and the power of the photovoltaic module is improved. In addition, first sub-fingers that are independent of one another on a first surface may be all connected via the first busbars or the second portions having a relatively higher dopant concentration. Compared to the first sub-fingers independent of one another, the connected first sub-fingers mitigate mismatch of different regions on the cell due to the non-uniformity of the performance of the cells and the local anomalies of the cells, facilitate further reduction of the module mismatch, and further improve the power of the photovoltaic module.

The embodiments of the present disclosure are described in detail with reference to the accompanying drawings. However, persons of ordinary skill in the art may understand, in the embodiments of the present disclosure, more technical details are provided for readers to better understand the present disclosure. However, even though these technical details and various variations and modifications based on the embodiments hereinafter, the technical solutions of the present disclosure may also be practiced.

Figure 17:
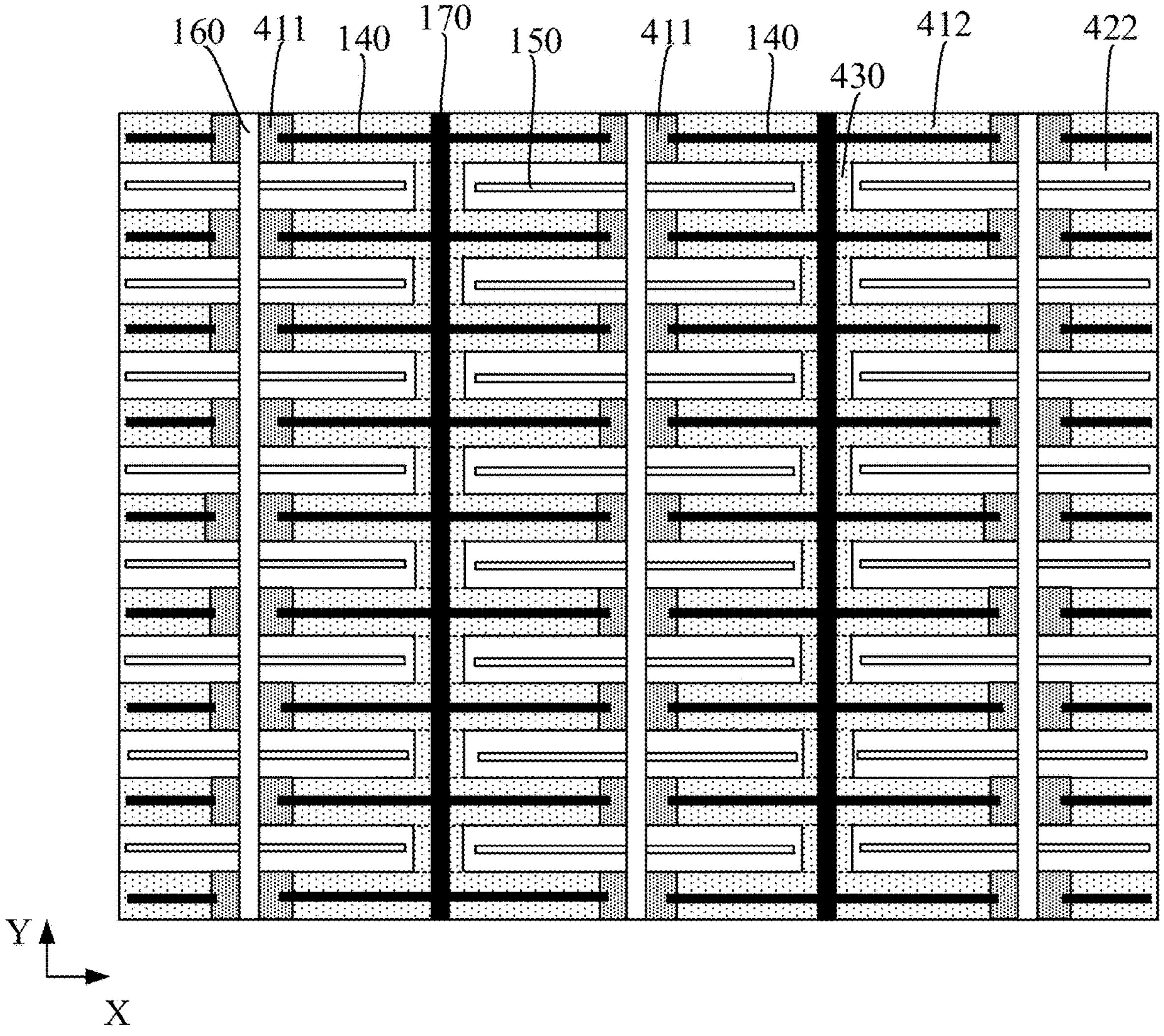
FIG. 17 is a schematic diagram illustrating a top view of a first surface of a solar cell according to some embodiments of the present disclosure.
Figure 18:
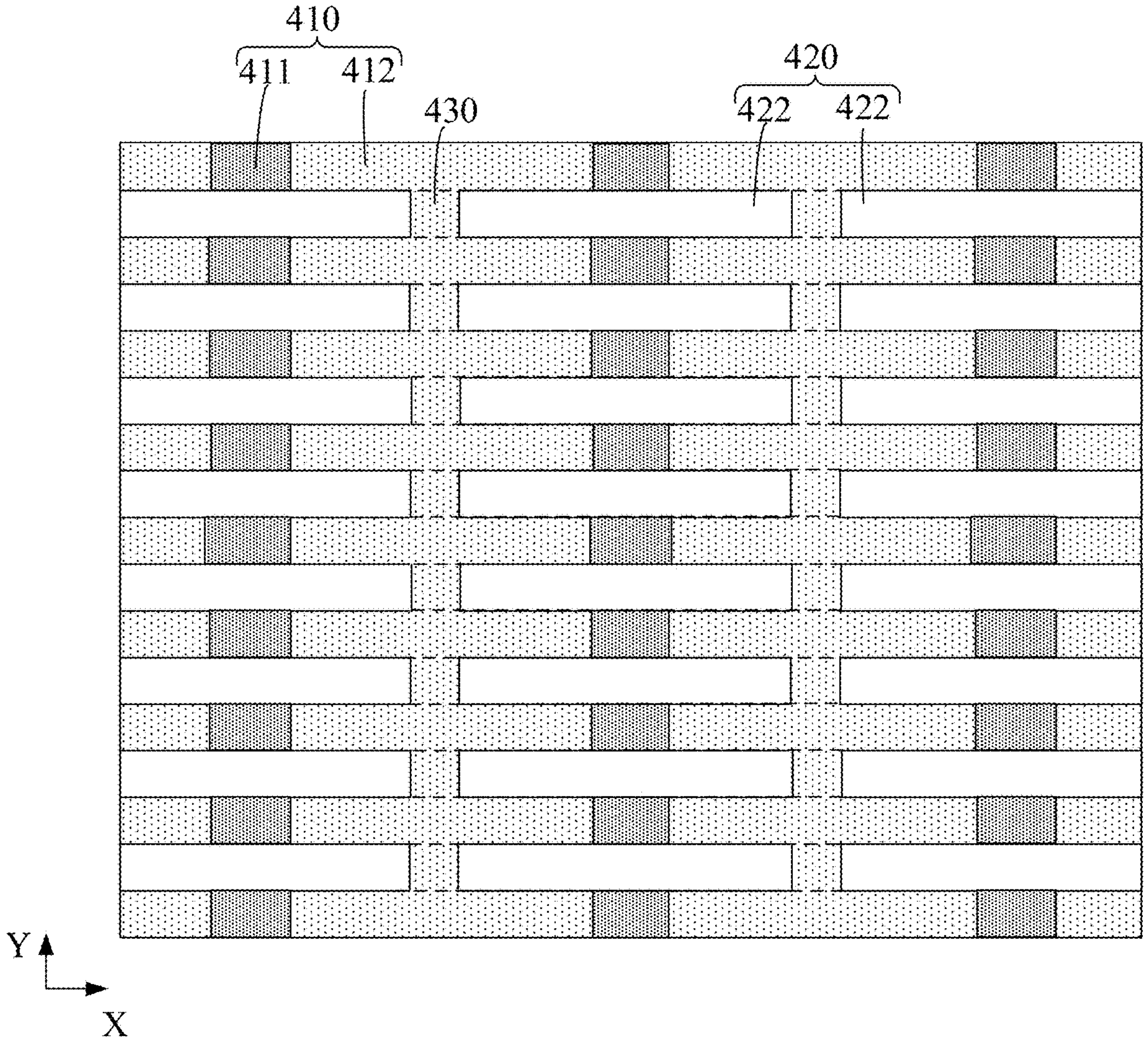
FIG. 18 is a schematic structural diagram of a back surface of a solar cell according to some embodiments of the present disclosure.
Figure 19:
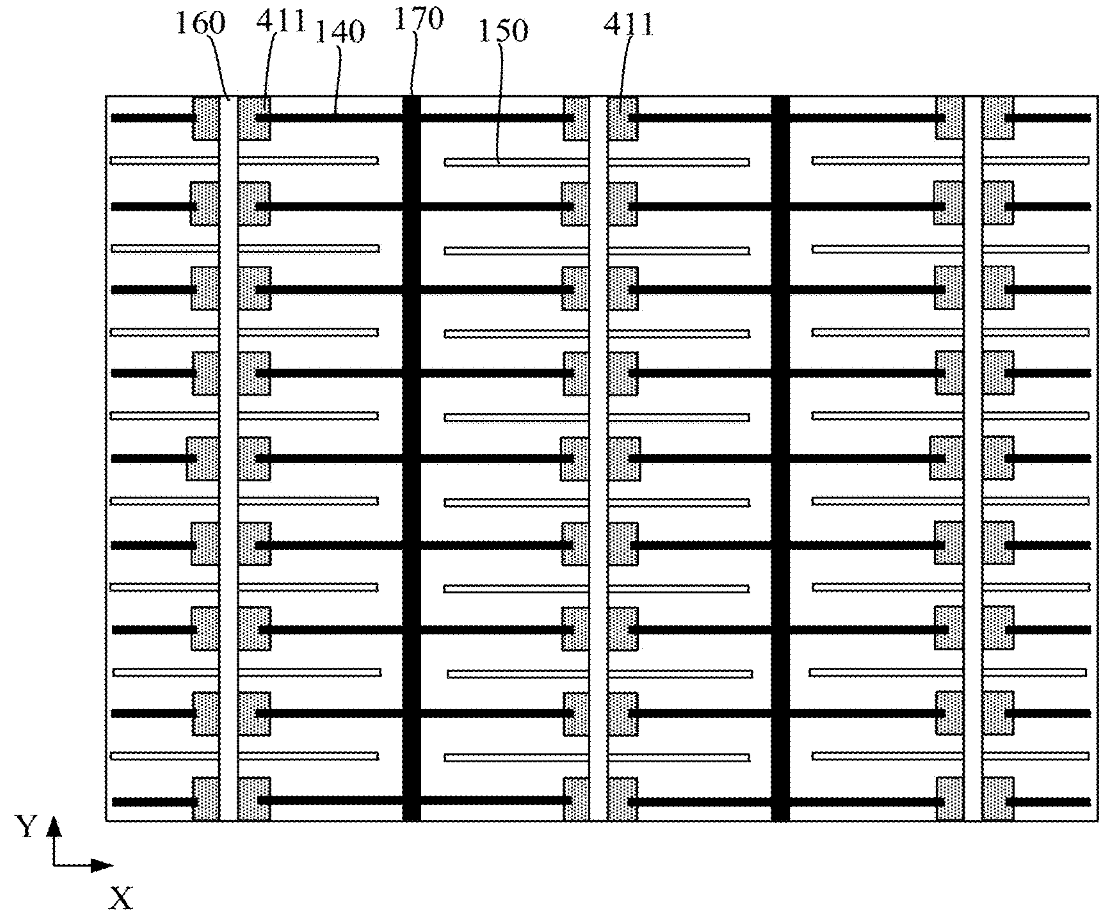
FIG. 19 is a schematic structural diagram of back gridlines of a solar cell according to some embodiments of the present disclosure.
Figure 20:
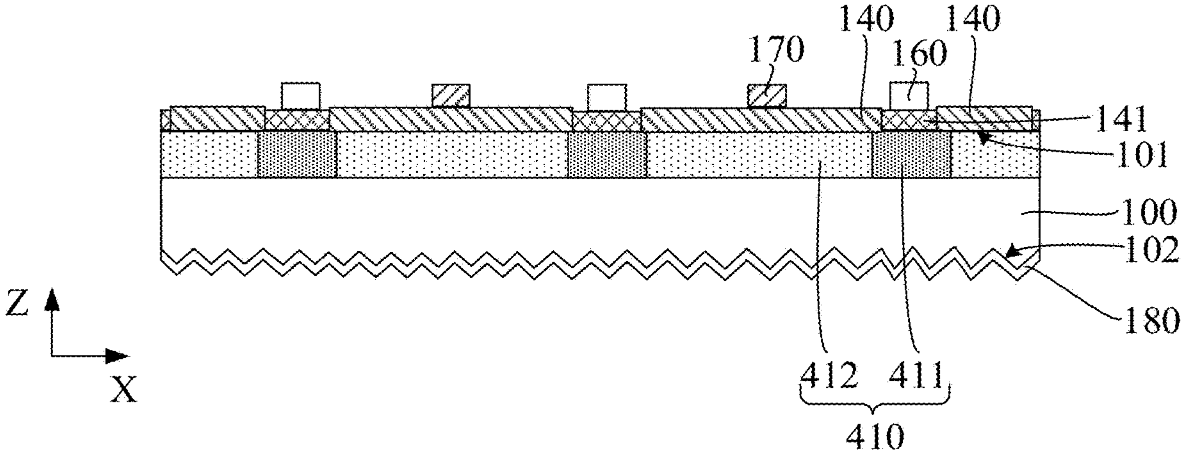
FIG. 20 is a schematic diagram illustrating a partial sectional view of a solar cell including first sub-fingers according to some embodiments of the present disclosure.
Figure 21:
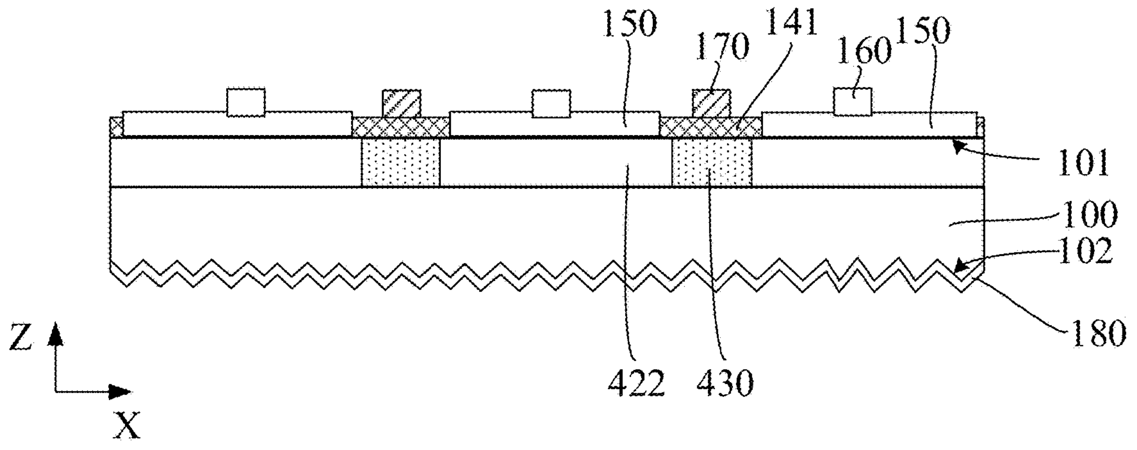
FIG. 21 is a schematic diagram illustrating a partial sectional view of a solar cell including second sub-fingers according to some embodiments of the present disclosure.
Figure 22:
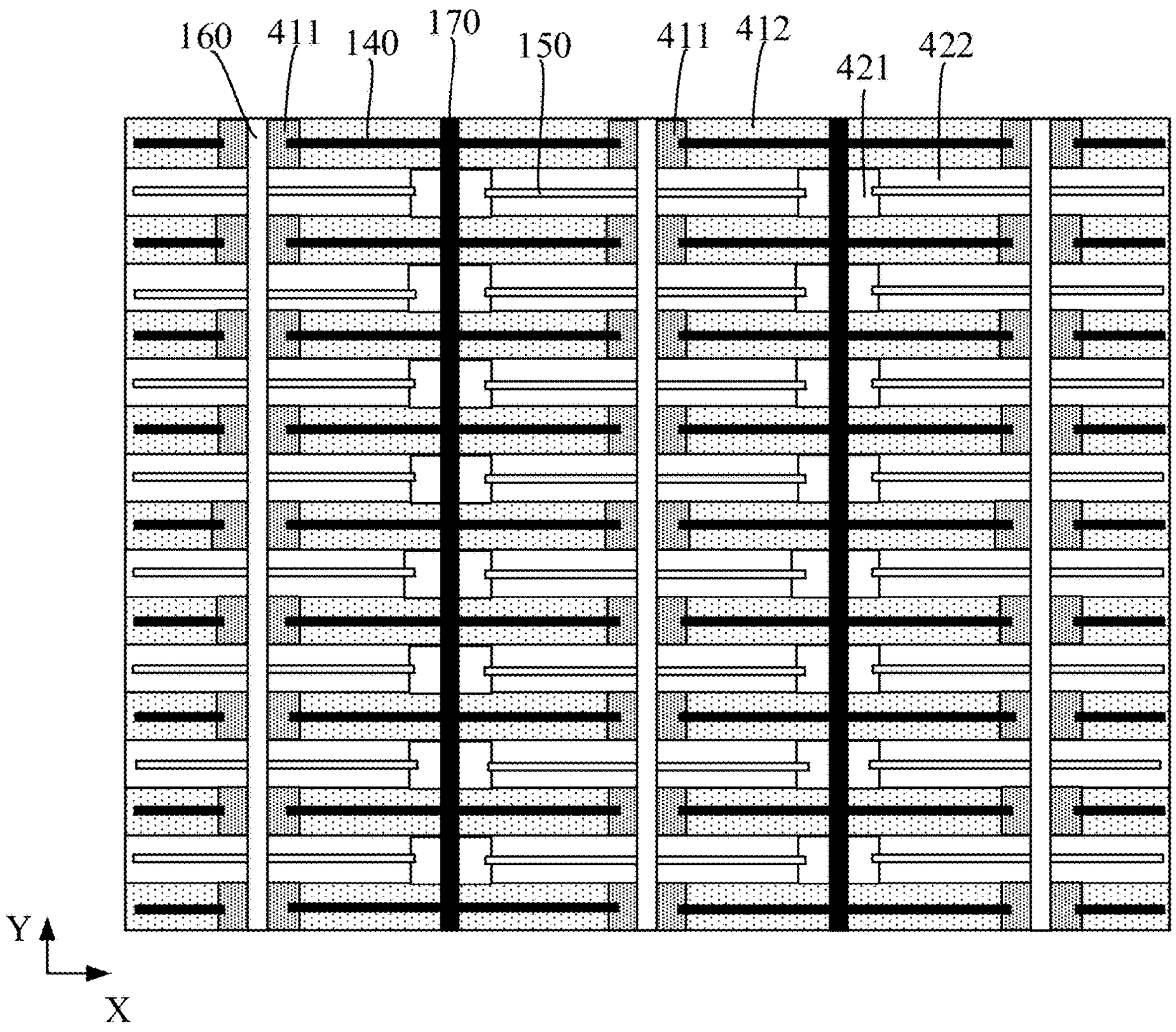
FIG. 22 is a schematic diagram illustrating a top view of a first surface of another solar cell according to some embodiments of the present disclosure.
Figure 23:
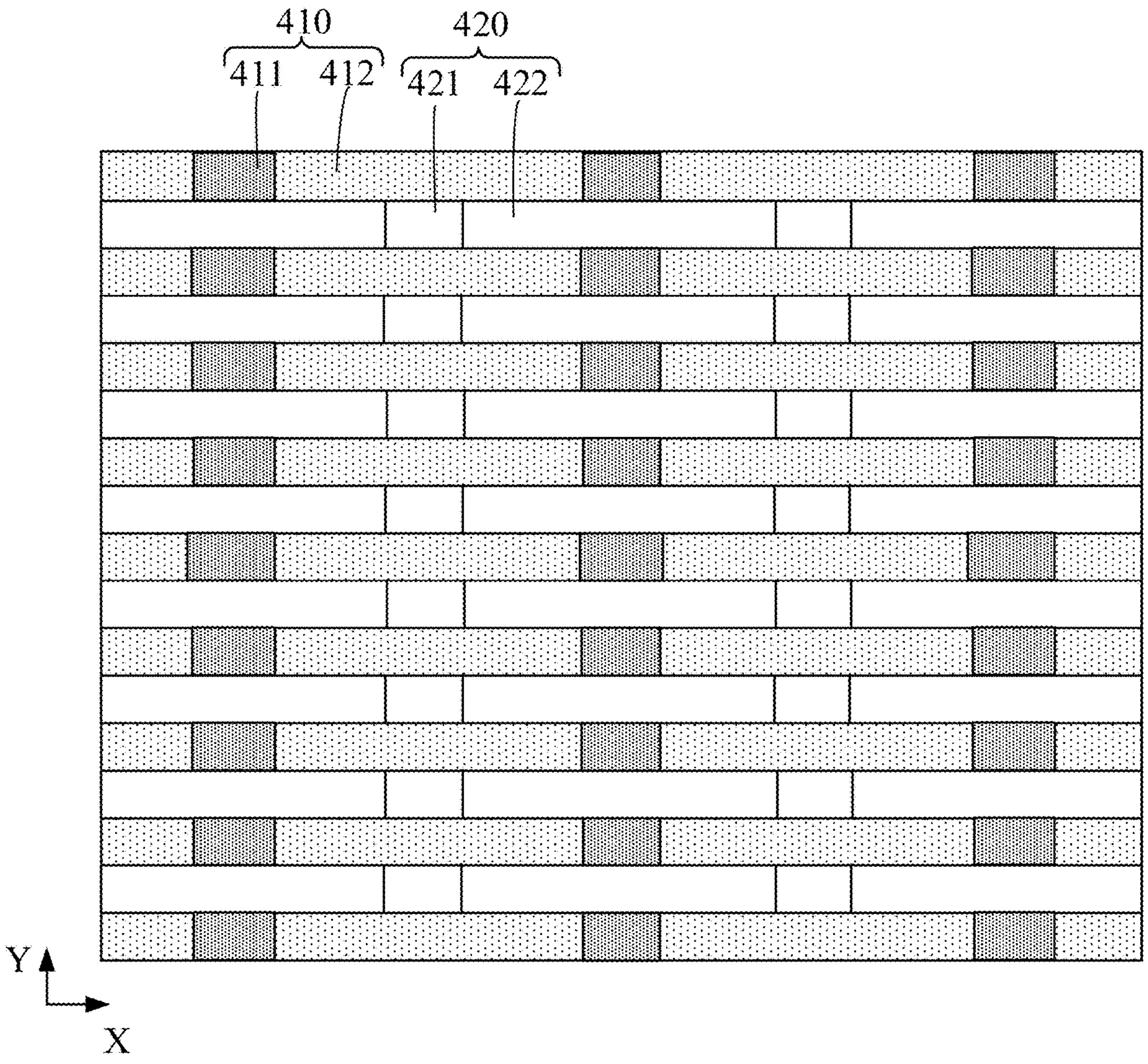
FIG. 23 is a schematic structural diagram of a back surface of another solar cell according to some embodiments of the present disclosure.
Figure 24:
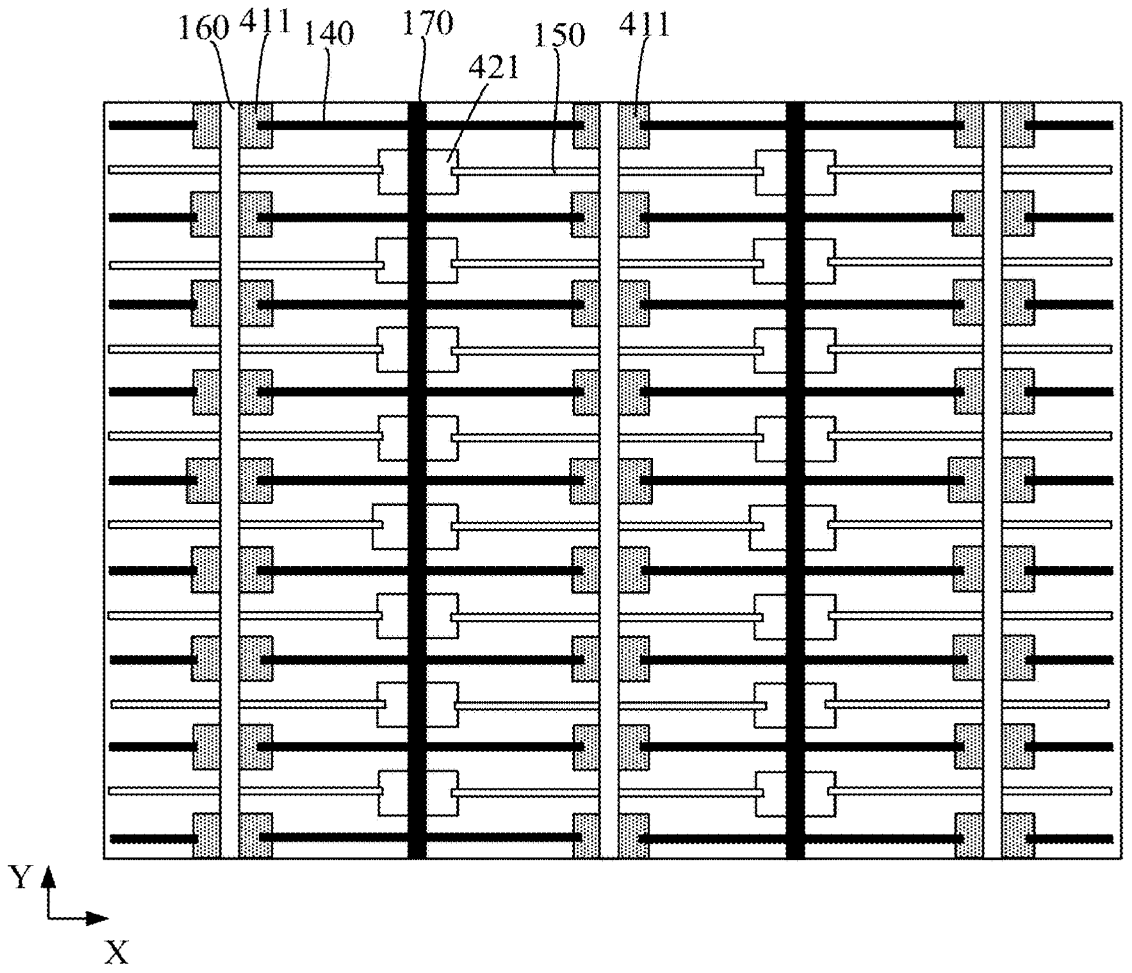
FIG. 24 is a schematic structural diagram of back gridlines of another solar cell according to some embodiments of the present disclosure.
Figure 25:
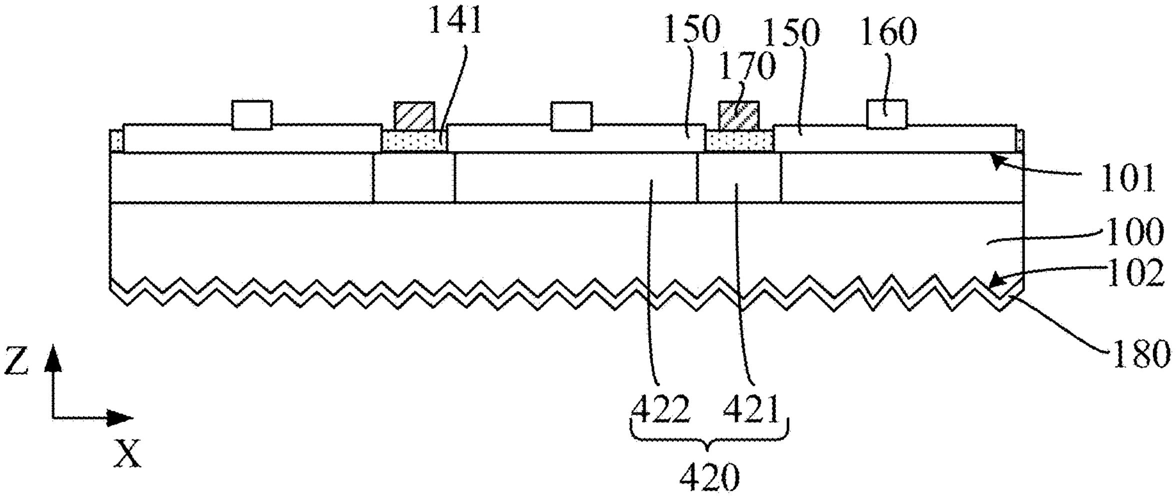
FIG. 25 is a schematic diagram illustrating a partial sectional view of another solar cell including second sub-fingers according to some embodiments of the present disclosure.

FIG. 17 is a schematic diagram illustrating a top view of a first surface of a solar cell according to some embodiments of the present disclosure. FIG. 18 is a schematic structural diagram of a back surface of a solar cell according to some embodiments of the present disclosure. FIG. 19 is a schematic structural diagram of back gridlines of a solar cell according to some embodiments of the present disclosure. FIG. 20 is a schematic diagram illustrating a partial sectional view of a solar cell including first sub-fingers according to some embodiments of the present disclosure. FIG. 21 is a schematic diagram illustrating a partial sectional view of a solar cell including second sub-fingers according to some embodiments of the present disclosure. FIG. 22 is a schematic diagram illustrating a top view of a first surface of another solar cell according to some embodiments of the present disclosure. FIG. 23 is a schematic structural diagram of a back surface of another solar cell according to some embodiments of the present disclosure. FIG. 24 is a schematic structural diagram of back gridlines of another solar cell according to some embodiments of the present disclosure. FIG. 25 is a schematic diagram illustrating a partial sectional view of another solar cell including second sub-fingers according to some embodiments of the present disclosure.

Referring to FIG. 17 to FIG. 25, the solar cell includes a substrate 100, an insulating layer 141, a plurality of fingers, first busbars and second busbars. The substrate 100 has a first surface 101. The first surface 101 has first doped portions 410 and second doped portions 420 that are alternatingly arranged along a first direction Y. The first doped portions 410 have a conductivity type different from that of the second doped portion 420. Each first doped portion 410 includes first portions 412 and second portions 411 that are alternatingly arranged along a second direction X. A dopant concentration of the second portions 411 is greater than a dopant concentration of the first portions 412. Each second doped portions 420 includes a plurality of third portions 422 arranged at intervals in the second direction X. The first direction Y is intersected with the second direction X. The insulating layer 141 is disposed on the first surface 101. The plurality of fingers are arranged on the first surface 101. The fingers extends through the insulating layer 141 along a thickness direction of the insulating layer 141. The plurality of fingers include first fingers and second fingers that are alternatingly arranged along the first direction Y. The first fingers include a plurality of first sub-fingers 140 arranged at intervals in the second direction X. The second fingers include a plurality of second sub-fingers 150 arranged at intervals in the second direction X. At least a portion of the first sub-fingers 140 is disposed on a corresponding ones of the first portions. Two adjacent first sub-fingers 140 in the second direction X are connected to each other via a corresponding one of the second portions 411. At least a portion of the second sub-fingers 150 is disposed on a corresponding ones of the third portions 422. The first busbars 170 and the second busbars 160 are alternatingly arranged in the second direction X, and extend along the first direction Y. Along the thickness direction of the insulating layer 141, the first busbars 170 and the second busbars 160 are disposed on the insulating layer 141. At least a portion of the second busbar 160 is disposed over a column of the second portions 411 arranged along the first direction Y. The first busbar 170 is connected to the first sub-fingers 140. The second busbar 160 is connected to the second sub-fingers 150.

Along the second direction X, the first portions 412 on two opposite sides of the second busbar 160 are connected via the second portion 411 having a relatively higher dopant concentration under the second busbar 160, such that the problem that the cell regions on two opposite sides of the second busbar exhibit different brightness levels during the EL testing due to the non-uniformity of the performance of the cells within regions on two opposite sides of the second busbar 160 or the local anomalies of the cells within regions on one side of the second busbar 160 along the second direction X is addressed. In this way, reduction of the module mismatch is facilitated, and the power of the photovoltaic module is improved. In addition, the first sub-fingers 140 that are independent of one another on the first surface 101 may be all connected via the first busbars 170 or the second portions 411 having a relatively higher dopant concentration. Compared to the first sub-fingers 140 independent of one another, the connected first sub-fingers 140 mitigate mismatch of different regions on the cells due to the non-uniformity of the performance of the cells and the local anomalies of the cells, facilitate further reduction of the module mismatch, and further improve the power of the photovoltaic module.

In some embodiments, the solar cell is a back-contact solar cell. The back-contact solar cell refers to a solar cell where electrodes (first fingers and second fingers) of different polarities are disposed on a back surface of the substrate 100.

In some embodiments, the substrate 100 may be made of an elemental semiconductor material. Specifically, the elemental semiconductor material is formed of a single element, for example, silicon or germanium. The elemental semiconductor material may be a monocrystalline state, a polycrystalline state, an amorphous state, or a microcrystalline (referred to as simultaneously having the monocrystalline state and the amorphous state). For example, silicon may be at least one of monocrystalline silicon, polycrystalline silicon, amorphous silicon, or microcrystalline silicon.

In some embodiments, the substrate 100 may also be made of a compound semiconductor material. Typical compound semiconductor materials include, but are not limited to, silicon germanium, silicon carbide, gallium arsenide, indium gallide, perovskite, cadmium telluride, copper indium selenium, or other materials. The substrate 100 may be a sapphire substrate, a silicon substrate on an insulator, or a germanium substrate on an insulator.

In some embodiments, the substrate 100 may be an N-type semiconductor substrate or a P-type semiconductor substrate. The N-type semiconductor substrate is doped with an N-type dopant element. The N-type dopant element may be any one of group V elements such as potassium (P), bismuth (Bi), antimony (Sb), arsenic (As), or the like. The P-type semiconductor substrate is doped with a P-type dopant element. The P-type dopant element may be any one of group III elements such as boron (B), aluminum (Al), gallium (Ga), indium (In), or the like.

In some embodiments, referring to FIG. 20, FIG. 21, and FIG. 25, along a thickness direction of the substrate 100, that is, a third direction Z, the substrate 100 has a first surface 101 and a second surface 102 that are opposite to each other. The first surface 101 of the substrate 100 may be a back surface, and the second surface 102 of the substrate 100 may be a front surface. The front surface may serve as a light-receiving surface configured to receive incident light, and the back surface may serve as a backlight surface The backlight surface is also capable of receiving incident light. However, the capability of receiving incident light by the backlight surface is poorer than the capability of receiving incident light by the light-receiving surface.

It should be noted that the incident light received by the light-receiving surface is light irradiated by the sun onto the solar cell, and the incident light received by the backlight surface is light reflected by the ground, reflected by another object, and reflected by a film layer on the substrate 100.

In some embodiments, a textured structure is arranged on the second surface 102 of the substrate 100. The textured structure may include pyramid structures with a regular shape or black silicon with an irregular shape. An inclined surface of the textured structure increases the internal reflection of the incident light, such that the absorption and utilization rates of the incident light on the substrate 100 are improved, and hence the photoelectric conversion efficiency of the solar cell is enhanced.

In some embodiments, a front surface field (not illustrated) layer is formed on the second surface 102 of the substrate 100, which has a conductivity type of dopant ions the same as that of dopant ions of the substrate 100, and thus achieves to reduce the concentration of the minority carriers on the surface by virtue of the field passivation effect. In this way, the recombination rate of the surface is reduced, and meanwhile, the series resistance is decreased, and the electron transmission capability is enhanced.

In some embodiments, the solar cell includes: a front-surface passivation layer 180. The front-surface passivation layer 180 is disposed on the second surface 102, and the front-surface passivation layer 180 is considered as a front passivation layer. In some embodiments, the front-surface passivation layer 180 may be a single-layer structure, or a multilayer (laminated or stacked) structure. In some embodiments, the front-surface passivation layer 180 may be made of one or more of silicon oxide, silicon nitride, silicon oxynitride, silicon carbon oxynitride, titanium oxide, hafnium oxide, or aluminum oxide.

In some embodiments, the first surface 101 may be a polished surface. The polished surface refers to a flat surface formed by removing the textured structure on the surface by a polishing solution or by laser etching. The polished back surface has an increased flatness, and thus reflection of light of long wavelengths is enhanced. This promotes secondary absorption of the incident light, such that the short-circuit current is increased. In the meantime, since the specific surface area of the back surface is decreased, back surface recombination is reduced, and the passivation effect on the back surface is enhanced.

Referring to FIG. 18 and FIG. 23, the first doped portions 410 and the second doped portions 420 that are alternatingly arranged along the first direction Y are arranged on the first surface 101. The first doped portions 410 has a conductivity type different from that of the second doped portions 420. The first doped portion 410 may be one of a P-type doped region and an N-type doped region, and the second doped portion 420 may be the other of a P-type doped region and an N-type doped region.

The first doped portions 410 and the second doped portions 420 are alternatingly arranged along the first direction Y, such that N-type doped regions and P-type doped regions on the first surface 101 are alternatingly and evenly distributed. This prevents N-type doped regions or P-type doped regions from having a large area, and hence prevents carriers from being collected by corresponding gridlines upon transportation by a long distance. In this way, recombination loss caused by long-distance transportation is reduced, short-circuit current is increased, series resistance is decreased, a fill factor is improved, and eventually photoelectric conversion efficiency of the solar cell is enhanced.

In some embodiments, the first doped portion 410 may be doped with dopant ions having a conductivity type the same as that of the substrate 100, and the second doped portion 420 may be doped with dopant ions having a conductivity type different from that of the substrate 100. For example, assuming that the substrate 100 is an N-type substrate, the first doped portion 410 is an N-type doped region, and the second doped portion 420 is a P-type doped region, then, PN junctions are formed between the second doped portions 420 and a remaining portion of the substrate 100 other than the second doped portions 420, which effectively diverts the carriers.

In some embodiments, a dopant concentration of the dopant ions in the first doped portion 410 is greater than a dopant concentration of the dopant ions in the substrate 100, such that high-low junctions are formed between the first doped portions 410 and the substrate 100, and thus the capability of diverting the carriers is enhanced. In some embodiments, the second doped portion 420 may be doped with dopant ions having a conductivity type the same as that of the substrate 100, and the first doped portion 410 may be doped with dopant ions having a conductivity type different from that of the substrate 100.

A gap or an isolator structure (not illustrated) is formed between the first doped portion 410 and the second doped portion 420, to implement automatic isolation between regions of different conductivity types. This may eliminate the impact on the cell efficiency due to current leakage caused by formation of a tunnel junction between heavily doped P and N regions on the back surface of the IBC cell.

In some embodiments, the solar cell includes a passivated contact structure. Hereinafter, description is given using a scenario where the first doped portion is doped with dopant ions having a conductivity type the same as that of the substrate 100 and the second doped portion is doped with dopant ions having a conductivity type different from that of the substrate 100 as an example.

In some embodiments, the first doped portion has a first passivated contact structure. The first passivated contact structure includes a first tunneling layer and a first doped conductive layer. The first tunneling layer is disposed between the substrate and the first doped portion. The first doped portion serves as the first doped conductive layer. The first doped conductive layer is doped with dopant ions having a conductivity type the same as that of the substrate. A dopant concentration of the dopant ions in the first doped conductive layer is greater than a dopant concentration of the dopant ions in the substrate. The first passivated contact structure provides good surface passivation. The first tunneling layer may cause majority carriers to tunnel into the first doped conductive layer while blocking recombination of minority carriers, such that the majority carriers is laterally transported in the first doped conductive layer and collected by metal electrodes. In this way, metal contact recombination current is greatly reduced, and open-circuit voltage and short-circuit current of the solar cell are improved.

In some embodiments, the first tunneling layer may be made of at least one of silicon oxide, silicon nitride, silicon oxynitride, silicon carbide, or magnesium fluoride.

In some embodiments, the first doped conductive layer may be made of at least one of amorphous silicon, polycrystalline silicon, or silicon nitride.

In some embodiments, the second doped portion has a second passivated contact structure. The second passivated contact structure includes a second tunneling layer and a second doped conductive layer. The second doped portion includes a second doped body, the second tunneling layer, and the second doped conductive layer that are successively arranged along a direction away from the substrate. The second doped body and the second doped conductive layer are both doped with dopant ions having a conductivity type different from that of the substrate. A dopant concentration of the doped ions in the second doped conductive layer is greater than a dopant concentration of the doped ions in the second doped body. The second passivated contact structure provides good surface passivation. The second tunneling layer may cause majority carriers to tunnel into the second doped conductive layer while blocking recombination of minority carriers, such that the majority carriers are laterally transported in the second doped conductive layer and collected by metal electrodes. In this way, metal contact recombination current is greatly reduced, and open-circuit voltage and short-circuit current of the solar cell are improved.

In some embodiments, the second tunneling layer may be made of at least one of silicon oxide, silicon nitride, silicon oxynitride, silicon carbide, or magnesium fluoride.

In some embodiments, the second doped conductive layer may be made of at least one of amorphous silicon, polycrystalline silicon, or silicon nitride.

It should be noted that in practice, both the first doped portion and the second doped portion may have a corresponding passivated contact structure; alternatively, one of the first doped portion and the second doped portion has a passivated contact structure and the other of the first doped portion and the second doped portion does not have a passivated contact structure; alternatively, neither the first doped portion nor the second doped portion has a passivated contact structure.

Referring to FIG. 17, FIG. 18, FIG. 22 and FIG. 23, the first doped portions 410 extend along the second direction X, and each first doped portion 410 includes the first portions 412 and the second portions 411 that are alternatingly arranged along the second direction X. The dopant concentration of the second portions 411 is greater than the dopant concentration of the first portions 412. Along the second direction X, two adjacent first portions 412 are connected to each other via one of the second portions 411. The individual first doped portion 410 is an entire doped region extending along the second direction X. At least a portion of the first sub-fingers 140 is disposed on the corresponding one of the first portions 412. Two of the first sub-fingers 140 that are independent of each other and adjacent along the second direction X are connected via one of the second portions 411. In this way, where the cell exhibit non-uniform performance in cell regions corresponding to different first portions 412 or an anomaly occurs in a cell region, any one of the first portions 412 may be at least connected to an adjacent one of the first portions 412 via one of the second portions 411. The first sub-finger 140 corresponding to the first portion 412 may be at least connected to the first sub-finger 140 corresponding to another one of the first portions 412 via the second portion 411, such that the carriers are capable of flowing or traveling between the first portion 412 and the adjacent first portion 412 thereof, and that the carriers collected by the first sub-finger 140 corresponding to the first portion 412 and collected by the first sub-finger 140 corresponding to the adjacent first portion 412 are capable of flowing or traveling between the first portion 412 and the adjacent first portion 412 thereof. In this way, uniformity of the performance of the cells is improved, the mismatch is mitigated, and the different brightness levels during the subsequent EL testing are mitigated, and the performance of the solar cell is enhanced.

It should be noted that the substrate 100 has two edges opposite to each other along the second direction X, and the first doped portions 410 that are close to the edge and disposed on an outermost side are the first portions 412.

Referring to FIG. 17, FIG. 18, FIG. 22, and FIG. 23, the first portion 412 and the second portion 411 have the same conductivity type. In the case that the first portion 412 is an N-type doped region, the second portion 411 is an N-type doped region, and the dopant concentration of the second portion 411 is greater than the dopant concentration of the first portion 412. In the case that the first portion 412 is a P-type doped region, the second portion 411 is a P-type doped region, and the dopant concentration of the second portion 411 is greater than the dopant concentration of the first portion 412. Configuring the dopant concentration of the second portion 411 to be greater is advantageous in that: The carriers are transported between two adjacent first sub-fingers 140 along the second direction X via the second portion 411, and the second portion 411 having a greater dopant concentration has a good carrier transportation capability, such that the resistance is decreased, the recombination loss during the transportation of the carriers is reduced, and hence the photoelectric conversion efficiency of the solar cell is improved.

Referring to FIG. 20, FIG. 21, and FIG. 25, the insulating layer 141 is disposed on the first surface 101, and the insulating layer 141 serves as a passivation layer. In some embodiments, the passivation layer may be of a single-layer film structure, or a multilayer film structure. In some embodiments, the passivation layer may be made of one or more of silicon oxide, silicon nitride, silicon oxynitride, silicon carbon oxynitride, titanium oxide, hafnium oxide, or aluminum oxide.

Referring to FIG. 17, FIG. 19, FIG. 22, and FIG. 24, arrangement of back gridlines of the solar cell is as follows. The gridlines include a plurality of fingers extending through the insulating layer 141 along the thickness direction of the insulating layer 141, and a plurality of busbars disposed on the insulating layer 141 and a portion of the fingers. The plurality of fingers include first fingers and second fingers, and the first fingers have a polarity different from that of the second fingers. The first fingers and the second fingers are alternatingly arranged along the first direction Y, and extend along the second direction X. The plurality of busbars include first busbars 170 and second busbars 160 that are alternatingly arranged along the second direction X. The first busbars 170 have a polarity different from that of the second busbars 160. The first busbars 170 and the second busbars 160 extend along the first direction Y. The first fingers have a polarity the same as that of the first busbars 170, and the second fingers have a polarity the same as that of the second busbars 160.

Specifically, still referring to FIG. 17, FIG. 19, FIG. 22, and FIG. 24, the first fingers extending along the second direction X includes a plurality of first sub-fingers 140 arranged at intervals in the second direction X. Along the third direction Z, a portion of each of the first sub-fingers 140 is disposed on a corresponding one of the first portions 412, and the first portions 412 may be in one-to-one correspondence with the first sub-fingers 140. The second fingers extending along the second direction X includes a plurality of second sub-fingers 150 arranged at intervals the second direction X. Along the third direction Z, a portion of each of the second sub-fingers 150 is disposed on a corresponding one of the third portions 422, and the third portions 422 may be in one-to-one correspondence with the second sub-fingers 150.

Along the third direction Z, at least a portion of the second busbar 160 is disposed over a column of the first portions 411 arranged along the first direction Y. The first busbar 170 is intersected with and connected to the first sub-fingers 140, and the second busbar 160 is intersected with and connected to the second sub-finger 150. Along the second direction X, a spacing is defined between the first sub-finger 140 and the second busbar 160, and a spacing is defined between the second sub-finger 150 and the first busbar 170; and the first sub-finger 140 is insulated from the second busbar 160, and the second sub-finger 150 is insulated from the first busbar 170.

The first busbar 170 is connected to a column of the first sub-fingers 140 arranged along the first direction Y, and the second busbar 160 is connected to a column of the second sub-fingers 150 arranged along the first direction Y. The first busbar 170 not only collects the carriers on the first sub-fingers 140, but also causes the carriers to flow or travel between the first doped portions 410 arranged along the first direction Y via the first busbar 170. In this way, the uniformity of the performance of the cells is improved, the mismatch is mitigated, and the different brightness levels during the subsequent EL testing are mitigated, and the performance of the solar cell is enhanced.

In some embodiments, the first sub-finger 140 and the second sub-finger 150 may be sintered from a burn-through slurry. In some embodiments, the first sub-finger 140 may be made of one or more of aluminum, silver, gold, nickel, molybdenum, or copper. In some embodiments, the second sub-finger 150 may be made of one or more of aluminum, silver, gold, nickel, molybdenum, or copper.

In some embodiments, the first busbar 170 and the second busbar 160 may be sintered from a non-burn-through slurry. The first busbar 170 and the second busbar 160 are disposed on a surface, away from the substrate 100, of the insulating layer 141. In this way, there is no need to design layout of the first doped portion 410 and the second doped portion 420, such that electrical contact between the first busbar 170 and the second doped portion 420 is prevented, electrical contact between the second busbar 160 and the first doped portion 410 is prevented, and hence short circuit is avoided. In addition, the first busbar 170 and the second busbar 160 may not cause any damage to the passivation layer, such that integrity of the film layer of the passivation layer is ensured, and hence a passivation effect of the passivation layer to the substrate 100 is enhanced. In this way, optical loss of the solar cell is reduced, and hence the photoelectric conversion efficiency is enhanced. In addition, since the non-burn-through slurry does not have much glass powder which may cause damages to the PN junction, metal recombination may be effectively reduced, the open-circuit voltage of the solar cell is increased, and the photoelectric conversion efficiency of the solar cell is enhanced.

The traditional slurry includes a mixture of metal powder, glass powder, and an organic carrier. The non-burn-through slurry refers to a slurry, which contains a smaller content of glass powder than the traditional slurry, has a weak run-through capability and is incapable of burning through the passivation layer during sintering. The burn-through slurry refers to a slurry, which has a strong run-through capability and is capable of burning through the passivation layer during sintering.

In some embodiments, the second busbar 160 has a conductivity type different from that of the second portion 411. That is, in the case that the second busbar 160 is a positive busbar, the second portion 411 is an N-type doped region; or in the case that the second busbar 160 is a negative busbar, the second portion 411 is a P-type doped region.

Each second doped portion 420 includes a plurality of third portions 422 arranged at intervals in the second direction X. For details about a doping type of a spacing region between two adjacent third portions 422 arranged along the second direction X, reference may be made to the following two cases.

In a first case, in some embodiments, referring to FIG. 17, FIG. 18, and FIG. 21, third doped portions 430 are further arranged on the first surface 101. Each third doped portion 430 is disposed between two adjacent third portions 422 in the second direction X. The third doped portion 430 and the first doped portion 410 have the same conductivity type, and a dopant concentration of the third doped portion 430 is equal to the dopant concentration of the first portion 412. Along a thickness direction of the third doped portions 430, at least a portion of the first busbar 170 is disposed over a column of the third doped portions 430 arranged along the first direction Y. That is, in the case that the first doped portion 410 is a P-type doped region, the third doped portion 430 is also a P-type doped region; or in the case that the first doped portion 410 is an N-type doped region, the third doped portion 430 is also an N-type doped region.

Specifically, the second doped portion 420 extends along the second direction X, and the second doped portion 420 includes a plurality of third portions 422 arranged at intervals in the second direction X. The second sub-fingers 150 are disposed on corresponding ones of the third portions 422. Along the third direction Z, at least a portion of the first busbar 170 is disposed over a column of the third doped portions 430 arranged along the first direction Y. The first busbar 170 and the third doped portion 430 have the same conductivity type. That is, in the case that the first busbar 170 is a positive busbar, the third doped portion 430 is a P-type doped region; or in the case that the first busbar 170 is a negative busbar, the third doped portion 430 is an N-type doped region.

In a second case, in some embodiments, referring to FIG. 22 to FIG. 25, the second doped portion 420 further includes fourth portions 421. Each of the fourth portions 421 is disposed between two adjacent third portions 422 adjacent along the second direction X. A dopant concentration of the fourth portion 421 is greater than a dopant concentration of the third portion 422. Two adjacent second sub-fingers 150 along the second direction X are connected to each other via a corresponding one of the fourth portions 421. Along the thickness direction of the insulating layer 141, at least a portion of the first busbar 170 is disposed over a column of the fourth portions 421 arranged along the first direction Y. That is, in the case that the third portion 422 is a P-type doped region, the fourth portion 421 is also a P-type doped region; or in the case that the third portion 422 is an N-type doped region, the fourth portion 421 is also an N-type doped region.

Specifically, referring to FIG. 22 to FIG. 25, the second doped portions 420 extend along the second direction X, and each second doped portion 420 includes the third portions 422 and the fourth portions 421 that are alternatingly arranged along the second direction X. The dopant concentration of the fourth portion 421 is greater than the dopant concentration of the third portion 422. Along the second direction X, two adjacent third portions 422 are connected to each other via one of the fourth portions 421. Each second doped portion 420 is an entire doped region extending along the second direction X. At least a portion of the second sub-fingers 150 is disposed on the corresponding one of the third portions 422. Two of the second sub-fingers 150 that are independent of each other and adjacent along the second direction X are connected via one of the fourth portions 421. In this way, where the cell exhibit non-uniform performance in cell regions corresponding to different third portions 422 or an anomaly occurs in a cell region, any one of the third portions 422 may be at least connected to an adjacent one of the third portions 422 via one of the fourth portions 421. The second sub-finger 150 corresponding to one of the third portions 422 may be at least connected to the second sub-finger 150 corresponding to another one of the third portions 422 via the fourth portion 421, such that the carriers are capable of flowing or traveling between the third portion 422 and the adjacent third portion 422 thereof, and that the carriers collected by the second sub-finger 150 corresponding to the third portion 422 and collected by the second sub-finger 150 corresponding to the adjacent third portion 422 are capable of flowing or traveling between the third portion 422 and the adjacent third portion 422 thereof. In this way, the uniformity of the performance of the cells is improved, the mismatch is mitigated, and the different brightness levels during the subsequent EL testing are mitigated, and the performance of the solar cell is enhanced.

It should be noted that the substrate 100 has two edges opposite to each other along the second direction X, and the second doped portions 420 that are closest to the edge and disposed on an outermost side are the third portions 422.

The third portions 422 and the fourth portions 421 have the same conductivity type. In the case that the third portion 422 is an N-type doped region, the fourth portion 421 is an N-type doped region, and the dopant concentration of the fourth portion 421 is greater than the dopant concentration of the third portion 422. In the case that the third portion 422 is a P-type doped region, the fourth portion 421 is a P-type doped region, and the dopant concentration of the fourth portion 421 is greater than the dopant concentration of the third portion 422. Configuring the dopant concentration of the fourth portion 421 to be greater is advantageous in that: The carriers are transported between two of the second sub-fingers 150 adjacent along the second direction X via the fourth portion 421, and the fourth portion 421 having a greater dopant concentration has a good carrier transportation capability, such that the resistance is decreased, the recombination loss during the transportation of the carriers is reduced, and hence the photoelectric conversion efficiency of the solar cell is improved.

Along the third direction Z, at least a portion of the first busbar 170 is disposed over a column of the fourth portions 421 arranged along the first direction Y. In some embodiments, the first busbar 170 and the fourth portion 421 have the same conductivity type. That is, in the case that the first busbar 170 is a positive busbar, the fourth portion 421 is an N-type doped region; or in the case that the first busbar 170 is a negative busbar, the fourth portion 421 is a P-type doped region.

The second busbar 160 not only collects the carriers on the second sub-fingers 150, but also causes the carriers to flow or travel between the second doped portions 420 arranged along the first direction Y via the second busbar 160. In this way, the uniformity of the performance of the cells is improved, the mismatch is mitigated, and the different brightness levels during the subsequent EL testing are mitigated, and the performance of the solar cell is enhanced.

In some embodiments, referring to FIG. 19 and FIG. 24, along the second direction X, a spacing between the second busbar 160 and the first sub-finger 140 is in the range of 50 μm to 100 μm, for example, 55 μm, 56 μm, 60 μm, 70 μm, or 86 μm. Since the second busbar 160 has a polarity different from that of the first sub-finger 140, along the second direction X, the spacing between the second busbar 160 and the first sub-finger 140 is excessively small. As a result, the second busbar 160 may be connected to the first sub-finger 140 to cause a short circuit, which affects the performance of the solar cell. In the case that the spacing between the second busbar 160 and the first sub-finger 140 is excessively large, a larger spacing may be present between two of the first sub-fingers 140 adjacent along the second direction X, and consequently, a transportation distance of the carriers is increased and thus the recombination loss is increased. Therefore, configuring the spacing between the second busbar 160 and the first sub-finger 140 to be in the range of 50 μm and 100 μm is not only conducive to ensuring mutual insulation between the gridlines having different polarities, but also conducive to preventing greater recombination loss.

In some embodiments, along the second direction X, the spacing between the second busbar 160 and the first sub-finger 140 may be in the range of 50 μm to 60 μm; and/or, along the second direction X, the spacing between the second busbar 160 and the first sub-finger 140 is in the range of 60 μm to 70 μm; and/or, along the second direction X, the spacing between the second busbar 160 and the first sub-finger 140 is in the range of 70 μm to 80 μm; and/or, along the second direction X, the spacing between the second busbar 160 and the first sub-finger 140 is in the range of 80 μm to 90 μm; and/or, along the second direction X, the spacing between the second busbar 160 and the first sub-finger 140 is in the range of 90 μm to 100 μm.

In some embodiments, referring to FIG. 19 and FIG. 24, along the second direction X, a spacing between the first busbar 170 and the second sub-finger 150 is in the range of 50 μm to 100 μm, for example, 55 μm, 56 μm, 60 μm, 70 μm, or 86 μm. Since the first busbar 170 has a polarity different from that of the second sub-finger 150, along the second direction X, the spacing between the first busbar 170 and the second sub-finger 150 is excessively small. As a result, the first busbar 170 may be connected to the second sub-finger 150 to cause a short circuit, which affects the performance of the solar cell. In the case that the spacing between the first busbar 170 and the second sub-finger 150 is excessively large, a larger spacing may be present between two of the second sub-fingers 150 adjacent along the second direction X, and consequently, a transportation distance of the carriers is increased and thus the recombination loss is increased. Therefore, configuring the spacing between the first busbar 170 and the second sub-finger 150 to be in the range of 50 μm and 100 μm is not only conducive to ensuring mutual insulation between the gridlines having different polarities, but also conducive to preventing greater recombination loss.

In some embodiments, along the second direction X, the spacing between the first busbar 170 and the second sub-finger 150 may be in the range of 50 μm to 60 μm; and/or, along the second direction X, the spacing between the first busbar 170 and the second sub-finger 150 is in the range of 60 μm to 70 μm; and/or, along the second direction X, the spacing between the first busbar 170 and the second sub-finger 150 is in the range of 70 μm to 80 μm; and/or, along the second direction X, the spacing between the first busbar 170 and the second sub-finger 150 is in the range of 80 μm to 90 μm; and/or, along the second direction X, the spacing between the first busbar 170 and the second sub-finger 150 is in the range of 90 μm to 100 μm.

In some embodiments, referring to FIG. 17, along the second direction X, a size of the second portion 411 is smaller than a size of the first portion 412. Configuring the size of the second portion 411 to be smaller is conducive to preventing the second portion 411 having a greater dopant concentration from affecting the performance of the first doped portion 410, and is also conducive to preventing the second portion 411 having an excessively large size from causing a long transportation distance of the carriers, such that a greater recombination loss is avoided.

In some embodiments, referring to FIG. 17, along the second direction X, the size of the second portion 411 is larger than a size of the second busbar 160. In this way, along the second direction X, sufficient spacings are ensured between the second busbar 160 and the first sub-fingers 140 on the first portions 412 disposed on two opposite sides of the second portions 411, and hence short circuit is prevented; and further, smaller spacings are ensured between the first sub-fingers 140 and the second portions 411, and hence the capabilities of two adjacent first sub-fingers 140 in transporting the carriers via the second portions 411 are enhanced.

In some embodiments, a ratio of the dopant concentration of the second portion 411 to the dopant concentration of the first portion 412 is in the range of 2 to 10. For example, the ratio may be 3, 4, 5, 7, or 9.

In some embodiments, a ratio of the dopant concentration of the second portion 411 to the dopant concentration of the first portion 412 is in the range of 5 to 10. For example, the ratio may be 5, 6, 7, 8, or 8.5. In the case that the dopant concentration of the second portion 411 is excessively low, the transportation efficiency of the carriers between two adjacent first sub-fingers 140 along the second direction X fails to be effectively improved. In the case that the dopant concentration of the second portion 411 is excessively high, the dopant ions in the second portion 411 are more likely to diffuse into the first portion 412, and consequently the performance of the first portion 412 is greatly affected. Therefore, configuring the ratio of the dopant concentration of the second portion 411 to the dopant concentration of the first portion 412 to be in the range of 5 to 10 is not only conducive to improving the transportation efficiency of the carriers, but also conducive to preventing the second portion 411 from causing a greater impact onto the performance of the first portion 412.

In some embodiments, the ratio of the dopant concentration of the second portion 411 to the dopant concentration of the first portion 412 is in the range of 5 to 6. In some embodiments, the ratio of the dopant concentration of the second portion 411 to the dopant concentration of the first portion 412 is in the range of 6 to 7. In some embodiments, the ratio of the dopant concentration of the second portion 411 to the dopant concentration of the first portion 412 is in the range of 7 to 8. In some embodiments, the ratio of the dopant concentration of the second portion 411 to the dopant concentration of the first portion 412 is in the range of 8 to 9. In some embodiments, the ratio of the dopant concentration of the second portion 411 to the dopant concentration of the first portion 412 is in the range of 9 to 10.

In some embodiments, the first doped portion 410 is a P-type doped region, and the dopant concentration of the first portion 412 may be in the range of $0.9\times10^{19}/cm^3$ to $2.2\times10^{19}/cm^3$, for example, $0.91\times10^{19}/cm^3$, $0.93\times10^{19}/cm^3$, $0.95\times10^{19}/cm^3$, $1\times10^{19}/cm^3$, or $2\times10^{19}/cm^3$.

In some embodiments, the first doped portion 410 is a P-type doped region. In some examples, the dopant concentration of the first portion 412 may be in the range of $0.9\times10^{19}/cm^3$ to $1.5\times10^{19}/cm^3$. In some examples, the dopant concentration of the first portion 412 may be in the range of $1.5\times10^{19}/cm^3$ to $2\times10^{19}/cm^3$. In some examples, the dopant concentration of the first portion 412 may be in the range of $2\times10^{19}/cm^3$ to $2.5\times10^{19}/cm^3$.

In some embodiments, the first doped portion 410 is an N-type doped region, and the dopant concentration of the first portion 412 may be in the range of $0.9\times10^{20}/cm^3$ to $2.2\times10^{20}/cm^3$, for example, $0.91\times10^{20}/cm^3$, $0.93\times10^{20}/cm^3$, $0.95\times10^{20}/cm^3$, $1\times10^{20}/cm^3$, or $2\times10^{20}/cm^3$.

In some embodiments, the first doped portion 410 is an N-type doped region. In some examples, the dopant concentration of the first portion 412 may be in the range of $0.9\times10^{20}/cm^3$ to $1.5\times10^{20}/cm^3$. In some examples, the dopant concentration of the first portion 412 may be in the range of $1.5\times10^{20}/cm^3$ to $2\times10^{20}/cm^3$. In some examples, the dopant concentration of the first portion 412 may be in the range of $2\times10^{20}/cm^3$ to $2.5\times10^{20}/cm^3$.

In some embodiments, the first doped portion 410 is a P-type doped region, and the dopant concentration of the second portion 411 may be in the range of $0.9\times10^{20}/cm^3$ to $1.1\times10^{20}/cm^3$, for example, $0.91\times10^{20}/cm^3$, $0.93\times10^{20}/cm^3$, $0.95\times10^{20}/cm^3$, $1\times10^{20}/cm^3$, or $1.1\times10^{20}/cm^3$.

In some embodiments, the first doped portion 410 is a P-type doped region, and the dopant concentration of the second portion 411 may be in the range of $0.9\times10^{20}/cm^3$ to $1\times10^{20}/cm^3$. In some embodiments, the first doped portion 410 is a P-type doped region, and the dopant concentration of the second portion 411 may be in the range of $1\times10^{20}/cm^3$ to $1.1\times10^{20}/cm^3$.

In some embodiments, the first doped portion 410 is an N-type doped region, and the dopant concentration of the second portion 411 may be in the range of $0.9\times10^{21}/cm^3$ to $1.1\times10^{21}/cm^3$, for example, $0.91\times10^{21}/cm^3$, $0.93\times10^{21}/cm^3$, $0.95\times10^{21}/cm^3$, $1\times10^{21}/cm^3$, or $1.1\times10^{21}/cm^3$.

In some embodiments, the first doped portion 410 is an N-type doped region, and the dopant concentration of the second portion 411 may be in the range of $0.9\times10^{21}/cm^3$ to $1\times10^{21}/cm^3$. In some embodiments, the first doped portion 410 is an N-type doped region, and the dopant concentration of the second portion 411 may be in the range of $1\times10^{21}/cm^3$ to $1.1\times10^{21}/cm^3$.

In some embodiments, referring to FIG. 19, along a thickness direction of the first doped portion 410, an orthographic projection of the first sub-finger 141 on the first surface 101 is overlapped with a portion of the first portion 412 and a portion of the second portion 411. That is, along the third direction Z, a portion of the first sub-finger 140 is also disposed on the second portion 411 for connecting the first sub-finger 140 and the adjacent first sub-finger 140 thereof. As such, the two first sub-fingers 140 adjacent along the first direction X are both directly connected to the second portion 411. This is conducive to improving the transportation efficiency of the carriers between the two first sub-fingers 140 adjacent along the second direction X, decreasing the resistance, reducing the recombination loss during transportation of the carriers, and improving the photoelectric conversion efficiency of the solar cell.

In some embodiments, referring to FIG. 22, each second doped portion 420 includes fourth portions 421. Each of the fourth portions 421 is disposed between two of the third portions 422 adjacent along the second direction X. Along the second direction X, a size of the fourth portion 421 is smaller than a size of the third portion 422. Configuring the size of the fourth portion 421 to be smaller is conducive to preventing the fourth portion 421 having a greater dopant concentration from affecting the performance of the second doped portion 420, and is also conducive to preventing the fourth portion 421 having an excessively large size from causing a long transportation distance of the carriers, such that a greater recombination loss is avoided.

In some embodiments, referring to FIG. 22, each second doped portion 420 includes fourth portions 421. Each of the fourth portions 421 is disposed between two of the third portions 422 adjacent along the second direction X. Along the second direction X, the size of the fourth portion 421 is larger than a size of the first busbar 170. In this way, along the second direction X, sufficient spacings are ensured between the first busbar 170 and the second sub-fingers 150 disposed on two opposite sides of the fourth portions 421, and hence short circuit is prevented; and further, smaller spacings are ensured between the second sub-fingers 150 and the fourth portions 421, and hence the capabilities of two of the second sub-fingers 150 adjacent along the second direction X in transporting the carriers via the fourth portions 421 are enhanced.

In some embodiments, a ratio of the dopant concentration of the fourth portion 421 to the dopant concentration of the third portion 422 is in the range of 2 to 10. For example, the ratio may be 3, 4, 5, 7, or 9.

In some embodiments, referring to FIG. 22, each second doped portion 420 includes fourth portions 421. Each of the fourth portions 421 is disposed between two of the third portions 422 adjacent along the second direction X. A ratio of the dopant concentration of the fourth portion 421 to the dopant concentration of the third portion 422 is in the range of 5 to 10. For example, the ratio may be 5, 6, 7, 8, or 8.5. In the case that the dopant concentration of the fourth portion 421 is excessively low, the transportation efficiency of the carriers between two of the second sub-fingers 150 adjacent along the second direction X fails to be effectively improved. In the case that the dopant concentration of the fourth portion 421 is excessively high, the dopant ions in the fourth portion 421 are more likely to diffuse into the third portion 422, and consequently the performance of the third portion 422 is greatly affected. Therefore, configuring the ratio of the dopant concentration of the fourth portion 421 to the dopant concentration of the third portion 422 to be in the range of 5 to 10 is not only conducive to improving the transportation efficiency of the carriers, but also conducive to preventing the fourth portion 421 from causing a greater impact onto the performance of the third portion 422.

In some embodiments, the ratio of the dopant concentration of the fourth portion 421 to the dopant concentration of the third portion 422 is in the range of 5 to 6. In some embodiments, the ratio of the dopant concentration of the fourth portion 421 to the dopant concentration of the third portion 422 is in the range of 6 to 7. In some embodiments, the ratio of the dopant concentration of the fourth portion 421 to the dopant concentration of the third portion 422 is in the range of 7 to 8. In some embodiments, the ratio of the dopant concentration of the fourth portion 421 to the dopant concentration of the third portion 422 is in the range of 8 to 9. In some embodiments, the ratio of the dopant concentration of the fourth portion 421 to the dopant concentration of the third portion 422 is in the range of 9 to 10.

In some embodiments, the second doped portion 420 is a P-type doped region, and the dopant concentration of the third portion 422 may be in the range of $0.9\times10^{19}/cm^3$ to $2.2\times10^{19}/cm^3$, for example, $0.91\times10^{19}/cm^3$, $0.93\times10^{19}/cm^3$, $0.95\times10^{19}/cm^3$, $1\times10^{19}/cm^3$, or $2\times10^{19}/cm^3$.

In some embodiments, the second doped portion 420 is a P-type doped region. In some examples, the dopant concentration of the third portion 422 may be in the range of $0.9\times10^{19}/cm^3$ to $1.5\times10^{19}/cm^3$. In some examples, the dopant concentration of the third portion 422 may be in the range of $1.5\times10^{19}/cm^3$ to $2\times10^{19}/cm^3$. In some examples, the dopant concentration of the third portion 422 may be in the range of $2\times10^{19}/cm^3$ to $2.5\times10^{19}/cm^3$.

In some embodiments, the second doped portion 420 is an N-type doped region, and the dopant concentration of the third portion 422 may be in the range of $0.9\times10^{20}/cm^3$ to $2.2\times10^{20}/cm^3$, for example, $0.91\times10^{20}/cm^3$, $0.93\times10^{20}/cm^3$, $0.95\times10^{20}/cm^3$, $1\times10^{20}/cm^3$, or $2\times10^{20}/cm^3$.

In some embodiments, the second doped portion 420 is an N-type doped region. In some examples, the dopant concentration of the third portion 422 may be in the range of $0.9\times10^{20}/cm^3$ to $1.5\times10^{20}/cm^3$. In some examples, the dopant concentration of the third portion 422 may be in the range of $1.5\times10^{20}/cm^3$ to $2\times10^{20}/cm^3$. In some examples, the dopant concentration of the third portion 422 may be in the range of $2\times10^{20}/cm^3$ to $2.5\times10^{20}/cm^3$.

In some embodiments, the second doped portion 420 is a P-type doped region, and the dopant concentration of the fourth portion 421 may be in the range of $0.9\times10^{20}/cm^3$ to $1.1\times10^{20}/cm^3$, for example, $0.91\times10^{20}/cm^3$, $0.93\times10^{20}/cm^3$, $0.95\times10^{20}/cm^3$, $1\times10^{20}/cm^3$, or $1.1\times10^{20}/cm^3$.

In some embodiments, the second doped portion 420 is a P-type doped region, and the dopant concentration of the fourth portion 421 may be in the range of $0.9\times10^{20}/cm^3$ to $1\times10^{20}/cm^3$. In some embodiments, the second doped portion 420 is a P-type doped region, and the dopant concentration of the fourth portion 421 may be in the range of $1\times10^{20}/cm^3$ to $1.1\times10^{20}/cm^3$.

In some embodiments, the second doped portion 420 is an N-type doped region, and the dopant concentration of the fourth portion 421 may be in the range of $0.9\times10^{21}/cm^3$ to $1.1\times10^{21}/cm^3$, for example, $0.91\times10^{21}/cm^3$, $0.93\times10^{21}/cm^3$, $0.95\times10^{21}/cm^3$, $1\times10^{21}/cm^3$, or $1.1\times10^{21}/cm^3$.

In some embodiments, the second doped portion 420 is an N-type doped region, and the dopant concentration of the fourth portion 421 may be in the range of $0.9\times10^{21}/cm^3$ to $1\times10^{21}/cm^3$. In some embodiments, the second doped portion 420 is an N-type doped region, and the dopant concentration of the fourth portion 421 may be in the range of $1\times10^{21}/cm^3$ to $1.1\times10^{21}/cm^3$.

It should be noted that the dopant concentration involved in the embodiments of the present disclosure may be an average dopant concentration measured from surfaces of corresponding film layers.

In some embodiments, each second doped portion 420 includes fourth portions 421. Each of the fourth portions 421 is disposed between two of the third portions 422 adjacent along the second direction X. Along a thickness direction of the second doped portion 420, an orthographic projection of the second sub-finger 150 on the first surface 101 is overlapped with a portion of the third portion 422 and a portion of the fourth portion 421. That is, along the third direction Z, a portion of the second sub-finger 150 is also disposed on the fourth portion 421 for connecting the second sub-finger 150 and the adjacent second sub-finger 150 thereof. As such, the two second sub-fingers 150 adjacent along the first direction X are both directly connected to the fourth portion 421. This is conducive to improving the transportation efficiency of the carriers between the two second sub-fingers 150 adjacent along the second direction X, decreasing the resistance, reducing the recombination loss during transportation of the carriers, and improving the photoelectric conversion efficiency of the solar cell.

Figure 26:
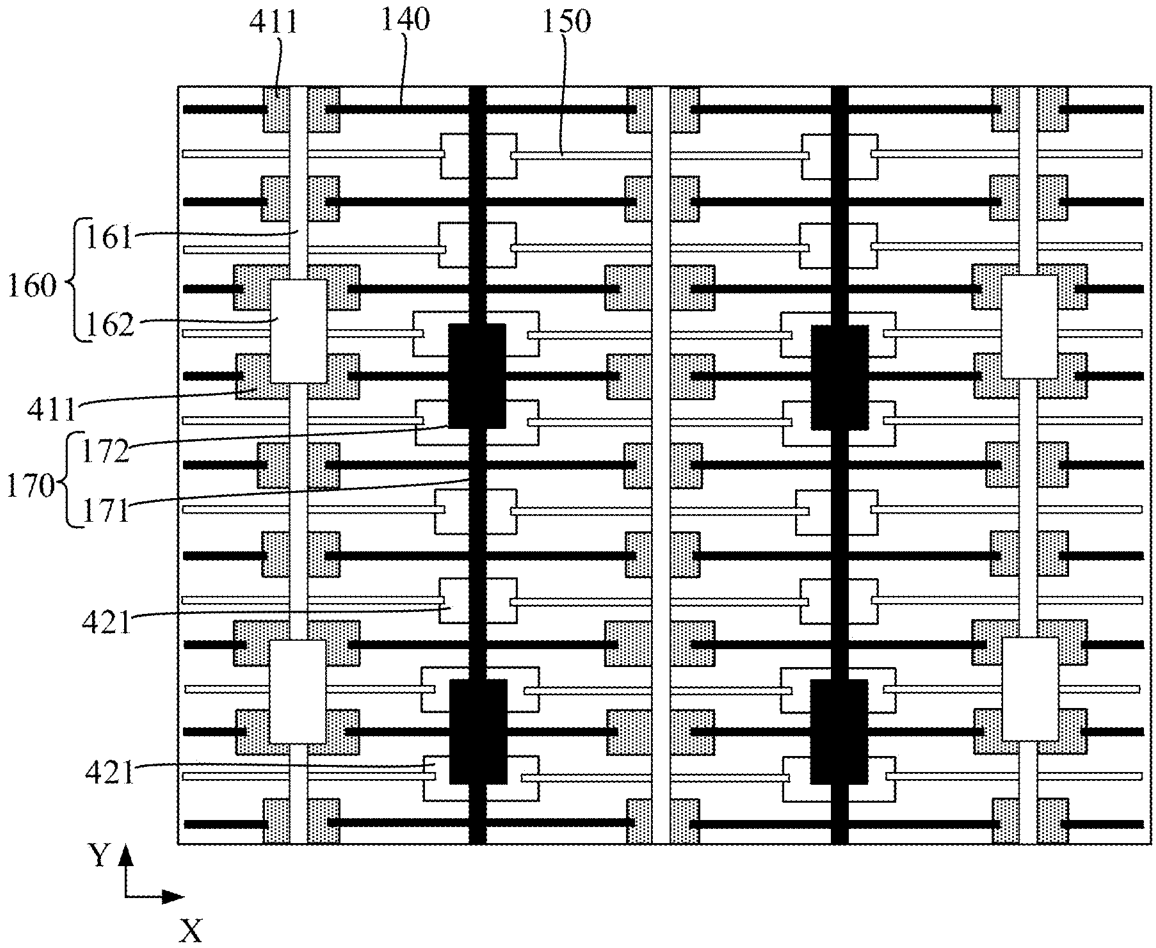
FIG. 26 is a schematic structural diagram of back gridlines of another solar cell according to some embodiments of the present disclosure.

FIG. 26 is a schematic structural diagram of back gridlines of another solar cell according to some embodiments of the present disclosure.

Referring to FIG. 26, in some embodiments, the first busbar 170 includes a first busbar body 171 and a first solder portion 172 that are arranged along the first direction Y. The first busbar body 171 extends along the first direction Y. Along the second direction X, a size of the first solder portion 172 is larger than a size of the first busbar body 171. The second busbar 160 includes a second busbar body 161 and a second solder portion 162 that are arranged along the first direction Y. The second busbar body 161 extends along the first direction Y. Along the second direction X, a size of the second solder portion 162 is larger than a size of the second busbar body 161.

Referring to FIG. 26, in some embodiments, along the second direction X, since the size of the first busbar body 171 is smaller than the size of the first solder portion 172, correspondingly, a size of the fourth portion 421 under the first busbar body 171 along the second direction X is smaller than a size of the fourth portion 421 under the first solder portion 172 along the second direction X. In this way, it is conducive to preventing the second sub-finger 150 from being connected to the first solder portion 172.

Referring to FIG. 26, in some embodiments, along the second direction X, since the size of the second busbar body 161 is smaller than the size of the second solder portion 162, correspondingly, a size of the second portion 411 under the second busbar body 161 along the second direction X is smaller than a size of the second portion 411 under the second solder portion 162 along the second direction X. In this way, it is conducive to preventing the first sub-finger 140 from being connected to the second solder portion 162.

Figure 27:
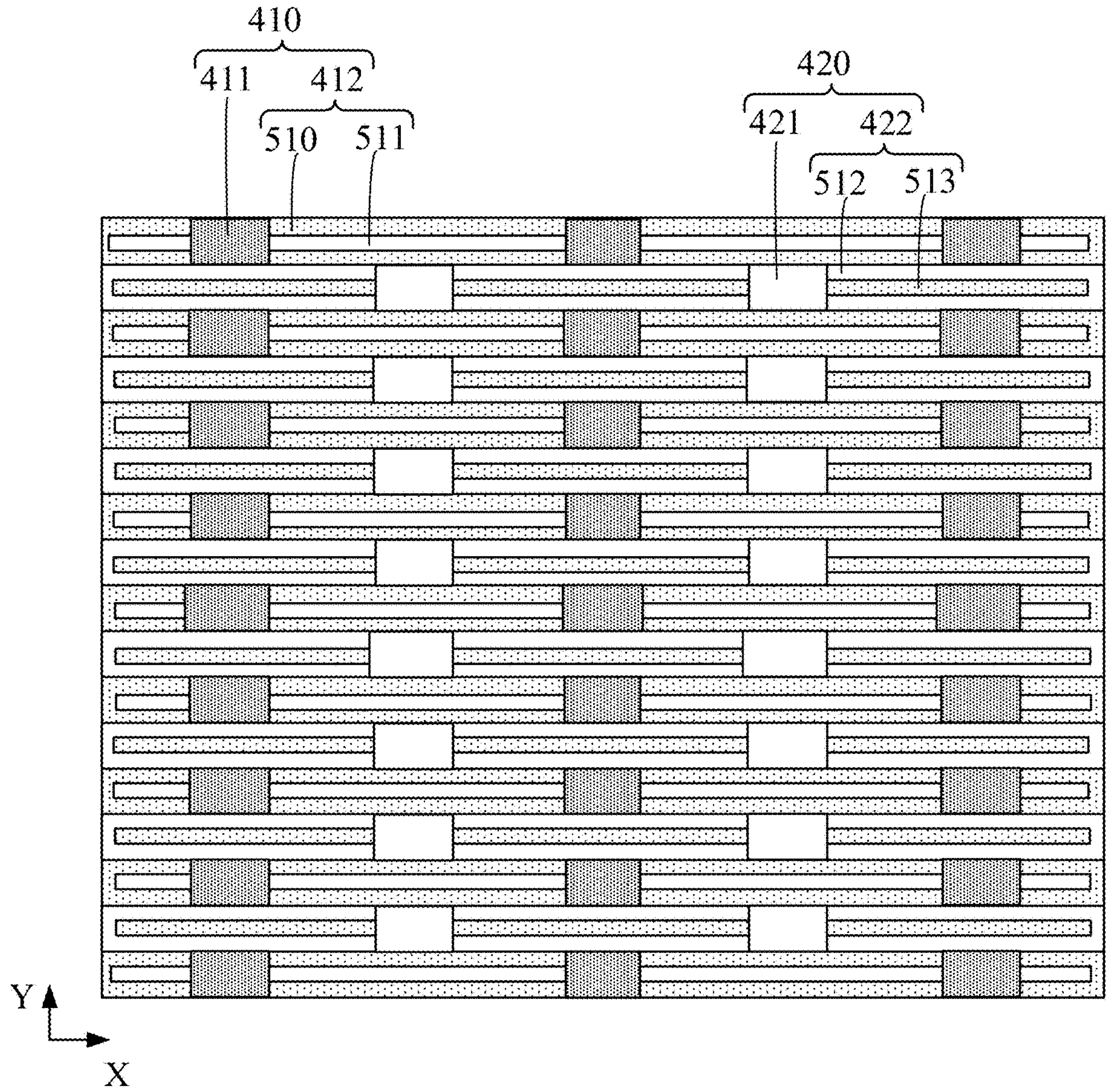
FIG. 27 is a schematic diagram illustrating a top view of a first surface of a further solar cell according to some embodiments of the present disclosure.

FIG. 27 is a schematic diagram illustrating a top view of a first surface of a further solar cell according to some embodiments of the present disclosure.

Referring to FIG. 27, in some embodiments, each first portion 412 includes a first lightly-doped portion 510 and a first heavily-doped portion 511. Along the third direction, the first sub-finger is disposed on the first heavily-doped portion 511. A dopant concentration of the first heavily-doped portion 511 is greater than a dopant concentration of the first lightly-doped portion 510. The first heavily-doped portion 511 serves as a selective emitter. In this way, the contact resistance between the first sub-finger and the first heavily-doped portion 511 is decreased, the recombination of the carriers is reduced, the output voltage and current of the solar cell are increased, and hence the photoelectric conversion efficiency of the solar cell is significantly enhanced.

In some embodiments, the first doped portion 410 is a P-type doped region, and the dopant concentration of the first lightly-doped portion 510 may be in the range of $0.5\times10^{19}/cm^3$ to $1.1\times10^{19}/cm^3$, for example, $0.6\times10^{19}/cm^3$, $0.7\times10^{19}/cm^3$, $0.75\times10^{19}/cm^3$, $1\times10^{19}/cm^3$, or $1.1\times10^{19}/cm^3$. In some embodiments, the first doped portion 410 is a P-type doped region, and the dopant concentration of the first heavily-doped portion 511 may be in the range of $1.5\times10^{19}/cm^3$ to $3\times10^{19}/cm^3$, for example, $1.71\times10^{19}/cm^3$, $1.83\times10^{19}/cm^3$, $1.95\times10^{19}/cm^3$, $2\times10^{19}/cm^3$, or $2.5\times10^{19}/cm^3$.

In some embodiments, the first doped portion 410 is an N-type doped region, and the dopant concentration of the first lightly-doped portion 510 may be in the range of $0.5\times10^{20}/cm^3$ to $1.1\times10^{20}/cm^3$, for example, $0.6\times10^{20}/cm^3$, $0.7\times10^{20}/cm^3$, $0.75\times10^{20}/cm^3$, $1\times10^{20}/cm^3$, or $1.1\times10^{20}/cm^3$. In some embodiments, the first doped portion 410 is an N-type doped region, and the dopant concentration of the first heavily-doped portion 511 may be in the range of $1.5\times10^{20}/cm^3$ to $3\times10^{20}/cm^3$, for example, $1.71\times10^{20}/cm^3$, $1.83\times10^{20}/cm^3$, $1.95\times10^{20}/cm^3$, $2\times10^{20}/cm^3$, or $2.5\times10^{20}/cm^3$.

Referring to FIG. 27, in some embodiments, each third portion 422 includes a second lightly-doped portion 512 and a second heavily-doped portion 513. Along the third direction, the second sub-finger is disposed on the second heavily-doped portion 513. A dopant concentration of the second heavily-doped portion 513 is greater than a dopant concentration of the second lightly-doped portion 512. The second heavily-doped portion 513 serves as a selective emitter. In this way, the contact resistance between the second sub-finger and the second heavily-doped portion 513 is decreased, the recombination of the carriers is reduced, the output voltage and current of the solar cell are increased, and hence the photoelectric conversion efficiency of the solar cell is significantly enhanced.

In some embodiments, the second doped portion 420 is a P-type doped region, and the dopant concentration of the second lightly-doped portion 512 may be in the range of $0.5\times10^{19}/cm^3$ to $1.1\times10^{19}/cm^3$, for example, $0.6\times10^{19}/cm^3$, $0.7\times10^{19}/cm^3$, $0.75\times10^{19}/cm^3$, $1\times10^{19}/cm^3$, or $1.1\times10^{19}/cm^3$. In some embodiments, the second doped portion 420 is a P-type doped region, and the dopant concentration of the second heavily-doped portion 513 may be in the range of $1.5\times10^{19}/cm^3$ to $3\times10^{19}/cm^3$, for example, $1.71\times10^{19}/cm^3$, $1.83\times10^{19}/cm^3$, $1.95\times10^{19}/cm^3$, $2\times10^{19}/cm^3$, or $2.5\times10^{19}/cm^3$.

In some embodiments, the second doped portion 420 is an N-type doped region, and the dopant concentration of the second lightly-doped portion 512 may be in the range of $0.5\times10^{20}/cm^3$ to $1.1\times10^{20}/cm^3$, for example, $0.6\times10^{20}/cm^3$, $0.7\times10^{20}/cm^3$, $0.75\times10^{20}/cm^3$, $1\times10^{20}/cm^3$, or $1.1\times10^{20}/cm^3$. In some embodiments, the second doped portion 420 is an N-type doped region, and the dopant concentration of the second heavily-doped portion 513 may be in the range of $1.5\times10^{20}/cm^3$ to $3\times10^{20}/cm^3$, for example, $1.71\times10^{20}/cm^3$, $1.83\times10^{20}/cm^3$, $1.95\times10^{20}/cm^3$, $2\times10^{20}/cm^3$, or $2.5\times10^{20}/cm^3$.

In some embodiments, the solar cell further includes an anti-reflective layer (not illustrated). The anti-reflective layer is disposed on a side, away from the back surface, of the passivation layer and on a side, away from the substrate 100, of the front-surface passivation layer 180. The first finger extends through the anti-reflective layer and the passivation layer and is in electrical contact with a surface of the first doped portion, and the second finger extends through the anti-reflective layer and the passivation layer and is in electrical contact with a surface of the second doped portion. The anti-reflective layer has a relatively high refractive index, and is configured to reduce reflection loss on the back surface of the cell. In some embodiments, the anti-reflective layer may be made of any one or more of silicon nitride or silicon oxynitride.

In the solar cell according to the embodiments of the present disclosure, along the second direction X, the first portions 412 on two opposite sides of the second busbar 160 connected via the second portions 411, such that the problem that the cell regions on two sides of the second busbars 160 exhibit different brightness levels during the EL testing due to the non-uniformity of the performance of the cells within regions on two sides of the second busbar 160 or the local anomalies of the cells within regions on one side of the second busbars 160 along the second direction X is addressed. In this way, reduction of the module mismatch is facilitated, and the power of the photovoltaic module is improved. In addition, different first sub-fingers 140 on the first surface 101 may be all connected via the first busbars 170 or the second portions 411 having a higher dopant concentration. Compared to the first sub-fingers 140 independent of one another, the connected first sub-fingers 140 mitigate mismatch of different regions on the cell due to the non-uniformity of the performance of the cells and the local anomalies of the cells, facilitate further reduction of the module mismatch, and further improve the power of the photovoltaic module.

Some embodiments of the present disclosure provide a photovoltaic module, which may be assembled using the solar cells as described in the above embodiments, to improve the performance of the photovoltaic module. It should be noted that for the part the same as or corresponding to the previous embodiments, reference may be made the corresponding description of the previous embodiments, which is be described in detail. The photovoltaic module according to the embodiments is described in detail with reference to the accompanying drawings.

The photovoltaic module includes: at least one cell string, including a plurality of solar cells as described above; a plurality of connection portions, each configured to electrically connect two adjacent solar cells of the plurality of solar cells; at least one encapsulation adhesive film, each configured to cover a surface of the at least one cell string; and at least one cover plate, each configured to cover a surface, away from the at least one cell string, of the at least one encapsulation adhesive film.

Figure 28:
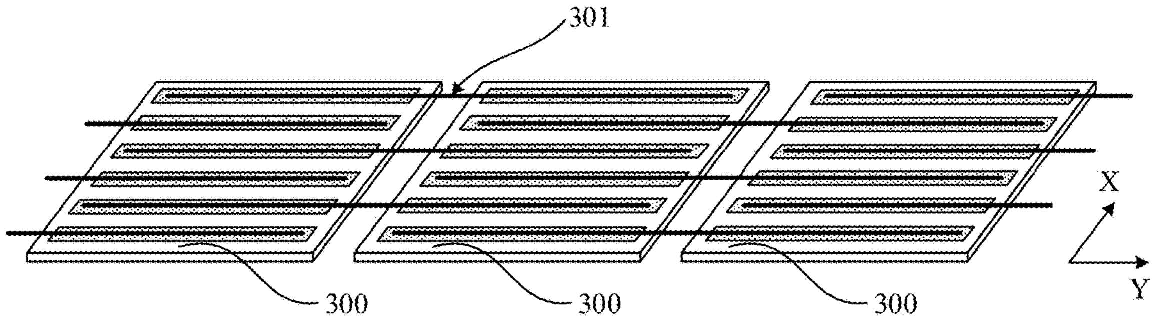
FIG. 28 is a schematic diagram illustrating a partial perspective view of a photovoltaic module according to some embodiments of the present disclosure.

FIG. 28 is a schematic diagram illustrating a partial perspective view of a photovoltaic module according to some embodiments of the present disclosure.

Referring to FIG. 28, in some embodiments, a plurality of solar cells 300 are successively arranged along the first direction Y, and each of the solar cells 300 may have the same structure as any of the solar cells 300 as shown in FIG. 5 to FIG. 14 or as shown in FIG. 17 to FIG. 27. The details are not given herein any further.

Two adjacent solar cells of the solar cells 300 are connected via a connection member 301. The connection member 301 is disposed on a surface, away from the body of the cell, of the busbar in the solar cell 300 and is in electrical contact with the busbar. One end of the connection member 301 is electrically connected to the first busbar of one of the two adjacent solar cells 300, and the other end of the connection member 301 is electrically connected to the second busbar of the other of the two adjacent solar cells 300. The connection member 301 may be soldered to the solder portion of the busbar, such that the connection member 301 is electrically connected to the busbar. A plurality of solar cells 300 are connected in series via several connection members 301.

The connection member 301 may be composed of a conductive layer and a solder layer covering a surface of the conductive layer. The conductive layer may be made of a conductive material with better conductivity, such as copper, nickel, gold, or silver, or an alloy material with low resistivity. The solder layer may be made of a material with relatively low melting point, such as a tin-zinc alloy, a tin-bismuth alloy, or a tin-indium alloy.

In some embodiments, the solder layer may have a flux, which refers to a chemical substance that assists and facilitates the soldering process, while providing protection against oxidation reactions. Since the melting point of the flux is lower than the melting point of the solder layer, the flux may advantageously increase the fluidity of the solder layer in the molten state, such that the connection member and the gridline structure are alloyed better. In some embodiments, the flux includes an inorganic flux, an organic flux, and a resin flux.

In some embodiments, the encapsulation adhesive film may be an organic encapsulation film such as an ethylene-vinyl acetate (EVA) adhesive film, a polyethylene octene co-elastomer (POE) adhesive film, or a polyvinyl butyral (PVB) adhesive film. The encapsulation adhesive film may prevent damages to the solar cell caused by harsh environments (such as rain, snow, sand, dust, heat, or the like), thereby enhancing the durability of the solar cell and extending its lifetime. Further, the encapsulation adhesive film may also prevent the formation of an oxide layer on the surface of the solar cell, thereby ensuring a maximum efficiency in converting solar energy into electrical energy.

In some embodiments, the cover plate may be a glass cover plate, a plastic cover plate, or the like that has a light transmission function. The cover plate may prevent impacts caused by the environment to the solar cell, and improve the lifetime and stability of the photovoltaic module.

The photovoltaic module according to the embodiments of the present disclosure includes the solar cells as shown in FIG. 5 to FIG. 14. Since specific spacings are configured between the edge busbar and the edge in solar cells, in the photovoltaic module formed by connecting the solar cells via connection members, the probability of cracking of the solar cells is low, and hence the yield of the photovoltaic module is higher.

The photovoltaic module according to the embodiments of the present disclosure includes the solar cells as shown in FIG. 17 to FIG. 27. Since in the solar cell, along the second direction, the first portions on two sides of the second busbar are connected via the second portion with a higher dopant concentration under the second busbar, and the mutually independent first sub-fingers disposed on the first surface may all be connected to one another via the first busbars or the second portions with a higher dopant concentration, it is conducive to reducing the phenomenon that different brightness levels are exhibited in different regions during the subsequent EL testing, and improving the power of the photovoltaic module.

In some embodiments, a solar cell is provided. The solar cell includes a substrate, having a first surface. First doped portions and second doped portions that are alternatingly arranged along a first direction are arranged on the first surface. The first doped portions having a conductivity type different from the second doped portions. Each first doped portion includes first portions and second portions that are alternatingly arranged along a second direction, and a dopant concentration of the second portions is greater than a dopant concentration of the first portions. Each second doped portion includes a plurality of third portions spaced apart along the second direction. The first direction is intersected with the second direction. The solar cell further includes an insulating layer, disposed on the first surface. The solar cell further includes a plurality of fingers disposed on the first surface and extending through the insulating layer along a thickness direction of the insulating layer. The plurality of fingers include first fingers and second fingers that are alternatingly arranged along the first direction. The first fingers include a plurality of first sub-fingers spaced apart along the second direction, and the second fingers include a plurality of second sub-fingers spaced apart along the second direction. At least a portion of the plurality of first sub-fingers is disposed on a corresponding one of the first portions, two of the plurality of first sub-fingers adjacent along the second direction are connected to each other via a corresponding one of the second portions. At least a portion of the plurality of second sub-fingers is disposed on a corresponding one of the third portions. The solar cell further includes first busbars and second busbars that extend along the first direction and are alternatingly arranged along the second direction. Along the thickness direction of the insulating layer, the first busbars and the second busbars are disposed on the insulating layer, at least a portion of the second busbars is disposed over a column of the second portions arranged along the first direction, the first busbar is connected to the plurality of first sub-fingers, and the second busbar is connected to the plurality of second sub-fingers.

In some embodiments, the second doped portion further includes fourth portions. Each of the fourth portions is disposed between two adjacent third portion of the third portions adjacent along the second direction, and a dopant concentration of the fourth portion is greater than a dopant concentration of the third portion, two adjacent sub-fingers of the second sub-fingers adjacent along the second direction are connected to each other via a corresponding one of the fourth portions, and along the thickness direction of the insulating layer, at least a portion of the first busbar is disposed over a column of the fourth portions arranged along the first direction.

In some embodiments, along the second direction, a size of the fourth portion is smaller than a size of the third portion, and/or, a size of the fourth portion is larger than a size of the first busbar.

In some embodiments, a ratio of the dopant concentration of the fourth portion to the dopant concentration of the third portion is in the range of 5 to 10.

In some embodiments, along a thickness direction of the second doped portion, an orthographic projection of the second sub-finger on the first surface is overlapped with a portion of the third portion and a portion of the fourth portion.

In some embodiments, the first busbar has a conductivity type different from that of the fourth portion.

In some embodiments, third doped portions are further arranged on the first surface. Each of the third doped portions is disposed between two adjacent third portions of the third portions along the second direction, the third doped portion and the first doped portion have a same conductivity type, a dopant concentration of the third doped portion is equal to the dopant concentration of the first portion, and along a thickness direction of the third doped portions, at least a portion of the first busbar is disposed over a column of the third doped portions arranged along the first direction.

In some embodiments, along the second direction, a spacing between the respective second busbar and the first sub-finger adjacent to the respective second busbar is in the range of 50 μm to 100 μm, and/or, a spacing between the first busbar and the second sub-finger is in the range of 50 μm to 100 μm.

In some embodiments, the second busbar has a conductivity type different from that of the second portion.

In some embodiments, along the second direction, a size of the second portion is smaller than a size of the first portion, and/or, a size of the second portion is larger than a size of the second busbar.

In some embodiments, a ratio of the dopant concentration of the second portion to the dopant concentration of the first portion is in the range of 5 to 10.

In some embodiments, along a thickness direction of the first doped portion, an orthographic projection of the first sub-finger on the first surface is overlapped with a portion of the first portion and a portion of the second portion.

In some embodiments, a photovoltaic module is provided. The photovoltaic module includes at least one cell string. Each of the at least one cell string includes a plurality of solar cells as described in the above embodiments. The photovoltaic module further includes a plurality of connection portion, each configured to electrically connect two adjacent solar cells of the plurality of solar cells. The photovoltaic module further includes at least one encapsulation adhesive film, each configured to cover a surface of the at least one cell string. The photovoltaic module further includes at least one cover plate, each configured to cover a surface, away from the at least one cell string, of the at least one encapsulation adhesive film.

Persons of ordinary skill in the art shall understand that the above embodiments are merely specific and exemplary embodiments for practicing the present disclosure, and in practice, various modifications may be made to these embodiments in terms of formality and detail, without departing from the spirit and scope of the present disclosure. Various variations and modifications may be made by one skilled in the art without departing from the spirit and scope of the present disclosure. Accordingly, the protection scope of the present disclosure is subjected to the appended claims.

What is claimed is:

1. A solar cell, comprising:

a substrate, having a first surface, wherein the first surface includes a central region and two edge regions disposed on two opposite sides of the central region, and a boundary between the central region and each of the edge regions extend along a first direction;

first conductive doped portions and second conductive doped portions alternatingly arranged along the first direction in the edge regions, wherein the first conductive doped portions have a conductivity type different from the second conductive doped portions, wherein a respective first conductive doped portion of the first conductive doped portions includes doped sub-portions arranged along a second direction, the doped sub-portions including a first doped sub-portion and second doped sub-portions disposed on two opposite sides of the first doped sub-portion, wherein a dopant concentration of the first doped sub-portion is greater than a dopant concentration of the second doped sub-portions;

a passivation layer, disposed on the first surface;

a plurality of fingers, disposed on the first surface, wherein the plurality of fingers extend through the passivation layer along a thickness direction of the passivation layer, and include first edge fingers and second edge fingers that are alternatingly arranged along the first direction, wherein a respective second edge finger of the second edge fingers is disposed on a respective one of the second conductive doped portions, wherein a respective first edge finger of the first edge fingers includes a first sub-finger and a second sub-finger that are spaced apart along a direction away from the central region, wherein at least a portion of the first sub-finger is disposed on one of the second doped sub-portions of the respective first conductive doped portion, and at least a portion of the second sub-finger is disposed on the other second doped sub-portions of the respective first conductive doped portion, wherein the second sub-finger is connected to the first sub-finger via the first doped sub-portion; and an edge busbar, disposed in a respective edge region of the two edge regions, wherein the edge busbar extends along the first direction, wherein the edge busbar is disposed on the passivation layer and over the first doped sub-portion, and wherein the edge busbar is connected to the second edge fingers.

2. The solar cell according to claim 1, wherein an orthographic projection of the first sub-finger on the first surface is overlapped with a portion of the second doped sub-portions and a portion of the first doped sub-portion.

3. The solar cell according to claim 2, wherein the first sub-finger is direct contact with the first doped sub-portion, and the second sub-finger is direct contact with the first doped sub-portion.

4. The solar cell according to claim 1, wherein an orthographic projection of the second sub-finger on the first surface is overlapped with a portion of the second doped sub-portions and a portion of the first doped sub-portion.

5. The solar cell according to claim 1, wherein along the second direction, the edge busbar is spaced apart from the first sub-finger by a spacing in the range of 50 μm to 100 μm.

6. The solar cell according to claim 1, wherein along the second direction, the edge busbar is spaced apart from the second sub-finger by a spacing in the range of 50 μm to 100 μm.

7. The solar cell according to claim 1, wherein the respective edge region has an edge away from the central region, and along the second direction, the edge busbar is spaced apart from the edge by a spacing in the range of 2 mm to 5 mm.

8. The solar cell according to claim 1, wherein along the second direction, a size of the first doped sub-portion is larger than a size of the edge busbar.

9. The solar cell according to claim 1, wherein within a same edge region, the second doped sub-portions and the first doped sub-portion have the same conductivity type.

10. The solar cell according to claim 1, wherein a ratio of a dopant concentration of the first doped sub-portion to a dopant concentration of the second doped sub-portions is in the range of 5 to 10.

11. The solar cell according to claim 1, wherein the first doped sub-portion has a conductivity type different from the edge busbar.

12. The solar cell according to claim 1, wherein the first conductive doped portions disposed in the two edge regions have the same conductivity type.

13. The solar cell according to claim 1, wherein the edge busbar includes a busbar body and a solder portion arranged along the first direction, the busbar body extends along the first direction, and along the second direction, a size of the solder portion is greater than a size of the busbar body.

14. The solar cell according to claim 13, wherein a size of the first doped sub-portion under the busbar body along the second direction is smaller than a size of the first doped sub-portion under the solder portion along the second direction.

15. The solar cell according to claim 1, wherein a respective second doped sub-portion of the second doped sub-portions includes a first portion and a second portion, the first edge finger is disposed on the second portion, and a dopant concentration of the second portion is greater than a dopant concentration of the first portion.

16. The solar cell according to claim 15, wherein the second portion serves as a selective emitter.

17. The solar cell according to claim 1, wherein a respective second conductive doped portion of the second conductive doped portions includes a third portion and a fourth portion, the respective second edge finger is disposed on the fourth portion, and a dopant concentration of the fourth portion is greater than a dopant concentration of the third portion.

18. The solar cell according to claim 17, wherein the fourth portion serves as a selective emitter.

19. The solar cell according to claim 1, wherein the solar cell includes a plurality of busbars disposed on a portion of the passivation layer and a portion of the plurality of fingers;

the plurality of busbars include first busbars and second busbars that are alternatingly arranged along the second direction, and the first busbars have a polarity different from the second busbars;

the plurality of fingers include first fingers and second fingers, and the first fingers have a polarity different from the second fingers;

the first busbars have a same polarity as the first fingers, and the second busbars have a same polarity as the the second fingers;

the first busbars and the second busbars extend along the first direction, the first busbars are connected to the first busbars, and the second busbars are connected to the second busbars;

along the second direction, the first fingers are spaced apart from the second busbars and the second fingers are spaced apart from the first busbars;

the first fingers are insulated from the second busbars and the second fingers are insulated from the first busbars;

the edge busbar is one of the first busbars or one of the second busbars in the respective edge region; and fingers having a polarity different from the edge busbar in the first fingers and the second fingers are the first edge fingers, and the other fingers of the first fingers and the second fingers are the second edge fingers.

20. A photovoltaic module, comprising:

at least one cell string, each including a plurality of solar cells according to claim 1;

a plurality of connection portion, each configured to electrically connect two adjacent solar cells of the plurality of solar cells;

at least one encapsulation adhesive film, each configured to cover a surface of the at least one cell string; and at least one cover plate, each configured to cover a surface, away from the at least one cell string, of the at least one encapsulation adhesive film.

* * * * *